(12) United States Patent
Sakai et al.

(10) Patent No.: US 6,633,322 B2
(45) Date of Patent: Oct. 14, 2003

(54) LIGHT EMITTING ELEMENT ARRAY, OPTICAL PRINTER HEAD USING THE SAME, AND METHOD FOR DRIVING OPTICAL PRINTER HEAD

(75) Inventors: Hisashi Sakai, Kyotanabe (JP); Motokazu Ogawa, Seika-cho (JP); Kazuaki Iwameji, Kizu-cho (JP)

(73) Assignee: Kyocera Corporation, Kyoto (JP)

( * ) Notice: Subject to any disclaimer, the term of this patent is extended or adjusted under 35 U.S.C. 154(b) by 9 days.

(21) Appl. No.: 09/870,101

(22) Filed: May 29, 2001

(65) Prior Publication Data

US 2001/0048459 A1 Dec. 6, 2001

(30) Foreign Application Priority Data

May 29, 2000 (JP) ........................................ 2000-158701
May 29, 2000 (JP) ........................................ 2000-158826
Jun. 29, 2000 (JP) ........................................ 2000-197397

(51) Int. Cl.[7] ................................................ B41J 2/435
(52) U.S. Cl. ........................ 347/233; 347/232; 347/247
(58) Field of Search ................................. 347/237, 238, 347/240, 247, 251, 252, 253, 132, 131, 130, 232, 233

(56) References Cited

U.S. PATENT DOCUMENTS

| | | | | | |
|---|---|---|---|---|---|
| 5,502,478 A | * | 3/1996 | Mimura | ...................... | 347/237 |
| 5,600,363 A | * | 2/1997 | Anzaki et al. | .............. | 347/237 |
| 5,892,532 A | * | 4/1999 | Katakura et al. | ........... | 347/240 |
| 6,166,757 A | * | 12/2000 | Murano | ...................... | 347/240 |
| 6,188,420 B1 | * | 2/2001 | Kuribayashi et al. | ........ | 347/132 |
| 6,194,960 B1 | * | 2/2001 | Nagumo | ...................... | 327/565 |

* cited by examiner

*Primary Examiner*—Hai Pham
(74) *Attorney, Agent, or Firm*—Hogan & Hartson, LLP

(57) ABSTRACT

A light emitting element array is provided with a plurality of light emitting diodes arranged in a row, field-effect transistors connected in series with the respective light emitting diodes, shift registers for individually turning the respective field-effect transistors on by individually supplying drive signals to gates of the respective field-effect transistors, and an emission controller for driving the light emitting diodes by supplying the emission signals, whose levels are so differed as to correspond to the respective light emitting diodes, to the light emitting diodes connected with the field-effect transistors when these field-effect transistors are individually turned on.

7 Claims, 16 Drawing Sheets

→ PRINTING DIRECTION
┄┄▶ TURN-ON DIRECTION

→ PRINTING DIRECTION
┄➤ TURN-ON DIRECTION

LIGHT EMITTING ELEMENT ARRAY, OPTICAL PRINTER HEAD USING THE SAME, AND METHOD FOR DRIVING OPTICAL PRINTER HEAD

BACKGROUND OF THE INVENTION

This invention relates to a light emitting element array constructed by arraying a plurality of light emitting elements such as light emitting diodes in a row, an optical printer head using such a light emitting element array and a method for driving such an optical printer head.

FIG. 17 is a plan view showing a first conventional light emitting element array which is a semiconductor light emitting device used for the construction of an optical printer head, for example, as shown in Japanese Unexamined Patent Publication No. 61-205153. In FIG. 17, identified by 101, 103 and 113 are a light emitting element array as a semiconductor light emitting device, light emitting elements which are light emitting diodes (LEDs), and electrode pads, respectively. An array of the light emitting elements 103 are integrated at a density of 10 to 48 per mm. The electrode pads 113 are provided in one-to-one correspondence with the light emitting elements 103 and are connected with external circuits via bonding wires. Accordingly, power from a power supply is supplied to the light emitting elements 103 via the bonding wires.

In order to ensure a space sufficient to enable the connection of the bonding wires, the electrode pads 113 are arranged in an offset manner at the opposite sides of a substrate 1. For example, 64 to 256 light emitting elements 103 are monolithically formed per chip, thereby constructing one light emitting element array 101. An optical printer head is constructed by mounting such light emitting element arrays 101 on one or a plurality of circuit boards.

FIG. 18 is a perspective view of a first conventional optical printer head constructed using the aforementioned first conventional light emitting element arrays 101. In FIG. 18, identified by 101 are light emitting element arrays; by 110 a circuit board on which light emitting element arrays 101 are mounted; by 111 conductive patterns provided on the circuit board; by 112 bonding wires for connecting electrode pads 113 of the light emitting element arrays 101 and the conductive patterns 111 on the circuit board 110; by 120 a flexible printed circuit (FPC); by 119 drivers for driving the light emitting element arrays 101; and by 121 wiring portions from data input terminals of the drivers 119. The conductive patterns 111 on the circuit board 110 are substantially at the same pitches as the light emitting elements 103.

Such an optical printer head is assembled as follows. First, the light emitting element arrays 101 are mounted on and bonded to the circuit board 110 by die bonding and then the electrode pads 113 of the bonded light emitting element arrays 101 and the conductive patterns 111 on the circuit board 110 are connected by the bonding wires 112. On the other hand, output wires (extending toward the light emitting element arrays 101) of the drivers 119 connected with the FPC 120 by, e.g., inner lead bonding are connected with the conductive patterns 111 on the circuit board 110 by a laser or thermal adhesion. In this way, the light emitting elements 103 and the output wires of the drivers 119 have a one-to-one correspondence, and a current is supplied to the light emitting elements 103 via the bonding wires 112. Signals and voltages are supplied to the light emitting elements 103 and the drivers 119 via the wiring portion 121 of the FPC 120.

FIG. 19 is a perspective view of a second conventional optical printer head. In FIG. 19, identified by 101 a light emitting element array; by 112 bonding wires; by 119 drivers; and by 121 input wiring portions (input signal patterns) provided on a circuit board 110 to feed input signals to the drivers 119.

The optical printer head shown in FIG. 19 is assembled as follows. First, the light emitting element array 101 and the drivers 119 are mounted on and bonded to the circuit board 110 by, e.g., die bonding and then the electrode pads 113 of the light emitting element array 101 and output electrodes of the drivers 119 are directly connected in one-to-one correspondence by the bonding wires 112.

On the other hand, similar to the output electrodes, input electrodes of the drivers 119 are directly connected with the input signal patterns 121 on the circuit board 110 via the bonding wires 112.

A comparison of the aforementioned two conventional printer heads shows that they adopt different methods for connecting the drivers 119 and the light emitting element arrays 101. Specifically, in the first conventional optical printer head, the output wiring portions of the drivers 119 are connected with the light emitting element array 101 after being bonded to the conductive patterns 111 on the circuit board 110 as shown in FIG. 18. However, in the second conventional optical printer head, the drivers 119 and the light emitting element arrays 101 are directly bonded to each other as shown in FIG. 19.

Further, the first and second conventional optical printer heads are similar in that the drivers 119 provided on two chips are used for driving the light emitting element array 101 provided on one chip to emit a light.

Although the electrode pads 113 of the light emitting element array 101 are generally arranged in an offset manner along the arranging direction of the light emitting elements 103 as shown in FIG. 17, they may be formed only at one side of the light emitting elements 103 (one-side output method). In such a case, the light emitting element array 101 formed on one chip can be driven to emit light by the driver 119 formed on one chip.

However, in the first and second conventional optical printer heads, since fairly high bonding pitch precision is required, it has been difficult to improve productivity of the optical printer head.

Also, in the first and second conventional optical printer heads, half the number to the same number of drivers as a total number of the light emitting element arrays are provided. This necessitates a large space for mounting many drivers on the circuit board and a mounting process, which hinders a reduction of production cost of the optical printer head.

Further, since the light emitting element arrays and the drivers are provided in parallel in the first and second conventional optical printer heads, it has been difficult to narrow a width of the optical printer head along a sub-scanning direction, which stands as a large hindrance to making the optical printer head smaller.

Furthermore, in the first conventional semiconductor light emitting device used for the first and second conventional optical printer head, precision of the wire bonding process and a limit in narrowing the pitches of the electrode pads stand as a large hindrance to narrowing the pitches between the light emitting elements. For example, it makes it difficult to realize a pitch of 22 $\mu$m or smaller between the light emitting elements which is required for 1200 dpi (dots/inch).

In view of this problem, a method for monolithically forming drivers on the light emitting element arrays 101 on which only the light emitting elements 103 and the electrode pads 113 were formed has been proposed to remarkably reduce the number of bonding as compared to the prior art, improve reliability, reduce production cost and enable high-quality printing resulting from the narrow-pitch-arrangement of the light emitting elements.

FIG. 20 is a plan view of a second conventional light emitting element array which is a semiconductor light emitting device used to construct an optical printer head, for example, as shown U.S. Pat. No. 4,587,717. Light emitting elements 103 which are GaP light emitting diodes, an output circuit 122a and a signal processing circuit 122b forming a driving circuit 122 for the light emitting elements 103 are monolithically formed on the same chip, i.e., a silicon substrate 102. Image data from the output circuit 122a are fed in parallel, serial or serial/parallel to the light emitting elements 103.

FIG. 21 is a plan view of a third conventional light emitting element array which is a semiconductor light emitting device used to construct an optical printer head (see Japanese Examined Patent Publication No. 6-94216). In FIG. 21, identified by 102 is a silicon substrate, on which a plurality of light emitting elements which are light emitting diodes and a plurality of driver elements 109 for driving these light emitting elements 103 are provided. The respective light emitting elements 103 and the respective driver elements 109 are monolithically integrated in one-to-one correspondence. In this way, the light emitting element array 101 including about 64 to 256 light emitting elements 103 and driver elements 109 is formed.

Identified by 124 in FIG. 21 is an element separating layer for optically separating the adjacent light emitting elements 103 and electrically separating the light emitting elements 103 and driver elements 109. The element separating layer 124 is provided around the light emitting elements 103 on the silicon substrate 102. A wiring portion 106 is adapted to electrically connect the light emitting elements 103 and the corresponding driver elements 109. Electrode pads 113 are formed on the silicon substrate 102, a number of electrode pads 113 necessary to feed signals for driving the light emitting elements 103 via the driver elements 109, e.g., 6 to 7 electrode pads 113 are provided for the light emitting element array 101 formed on one chip. Diffused resistors 108 form ohmic contacts with the light emitting elements 103 and provide electrical insulation from the silicon substrate 102 to restrict a current flowing between the light emitting elements 103 and the driver elements 109. It should be noted that an insulting layer 107 is provided on the driver elements 109.

FIG. 22 is an equivalent circuit diagram of the light emitting element array 101 shown in FIG. 21. Although this equivalent circuit diagram shows one light emitting element 103, the diffused resistor 108 which acts to restrict a current and the driver element 109 are connected with each light emitting element 103. In other words, the light emitting elements 103 are electively cause to emit light by the driver elements 109 and un-illustrated logic circuits (registers). In order to cause the light emitting element 103 to emit light, a constant voltage Vdd is applied to the driver element 109 after turning it on. At this time, a current flowing onto the light emitting element 103 is supplied via the diffused resistor 108.

FIG. 23 is a perspective view of a third conventional optical printer head constructed using a plurality of light emitting element arrays 101 shown in FIG. 21. Identified by 110 in FIG. 23 is a circuit board, on which a plurality of light emitting element arrays 101 are arrayed, mounted and fixed by an adhesive such that all the light emitting elements 103 are linearly aligned. Electrode pads of the light emitting element arrays 101 and a circuit pattern 111 (conductive patterns) formed on the circuit board 110 are connected via bonding wires 112. Signals from logic circuits and electric power are supplied to the respective light emitting element arrays 101 via an input connector 125 as an interface provided on the circuit board 110 to be electrically connected with the circuit pattern 111.

In the above-mentioned third conventional light emitting element array, however, the constant voltage Vdd is commonly applied to the respective light emitting elements 103 of the light emitting element array 101. In this case, the respective light emitting elements 103 are driven by controlling the transistors of the driver elements by the unillustrated logic circuit (shift register).

In this case, about 6 or 7 bonding pads are provided for feeding logic circuit signals and the constant voltage to drive the light emitting elements 103. However, because of driving by the constant voltage, it is difficult to correct an emission variation in the light emitting element array or among the light emitting elements.

Further, in the conventional light emitting element arrays, usually, the emission intensity of the light emitting elements 103 greatly varies in the light emitting element array 101 and among production lots of the light emitting element arrays 101. Such variations directly influence the printing quality of a printer using the optical printer head. Accordingly, light emitting element arrays in which the variation of the light emission is below ±10% are classified as good, while the other light emitting element arrays are classified and scrapped away as bad. Comparing to good light emitting element arrays, the number of bad light emitting element arrays is considerably great, consequently causing the problem that the yield of good light emitting element arrays is very low.

In view of the above, the conventional optical printer heads adopt a method for broadening a range of variation of emission intensity within which the light emitting element arrays are judged to be good products and improving a yield of the light emitting element arrays by providing the drivers for driving the light emitting element arrays with a function of correcting the variation of the emission intensity among the light emitting element arrays.

This correction is made by a following method. After a variation of the emission intensity when a light emitting element array wired and mounted on an optical printer head is driven by a constant voltage is measured as an initial value, drive voltages (currents) for the respective light emitting elements are so adjusted as to make the emission intensity uniform in the light emitting element arrays and among the light emitting element arrays. There are two such correcting methods.

A first correcting method is for adjusting values of currents flowing into the light emitting elements when the constant voltage is applied by adjusting (trimming) resistance components connected in series with the light emitting elements according to the initial value.

A second correcting method is for adjusting outputs of transistors forming the driver elements by correction data superposed on an image data according to the initial value.

FIG. 24 shows a block diagram of a driver circuit for making 16-stage corrections by the second correcting method. At least four transistors having different outputs are required per dot of the light emitting element, and at least four stages of correcting circuits 126 formed by a shift register having as many parallel outputs as the light emitting elements to be driven are required in order to input the correction data to the respective transistors and a latch.

In the case that the first correcting method is applied to the third prior art, a resistance value of the diffused resistor 108 shown in FIG. 22 needs to be adjusted. However, it is difficult to adjust the diffused resistance value by adjusting the density and depth of dopants diffusion and by annealing after the light emitting element array is wired and mounted on the optical printer head. Thin film resistance wiring portion whose resistance value can be trimmed or an other trimming circuit needs to be monolithically formed in addition to the diffused resistors.

In the case that the second correcting method is applied to the third prior art, a plurality of stages of shift registers and latches corresponding to the respective gradations need to be monolithically formed.

Accordingly, the chip size of the third conventional light emitting element array becomes larger as the size of the driver circuits becomes larger with the increase of their functions. Thus, a smaller number of chips can be obtained from one wafer.

Further, in proportion to the size of the monolithically formed driver circuits, a yield of the light emitting element arrays decreases. This also applies to the second conventional light emitting element arrays. The aforementioned problems residing in the second and third conventional light emitting element arrays cancel the reduced production cost and the improved reliability of the optical printer head which are obtained from the improved yield by considerably reducing the number of connection terminals and the reduced production cost by reducing the number of driver chips. Thus, the second and third conventional light emitting element arrays are a little realizable in view of the production cost.

SUMMARY OF THE INVENTION

It is an object of the present invention to provide a light emitting element, an optical printer head, and a method for driving an optical printer head which are free from the above-mentioned problems residing in the prior art.

It is an object of the present invention to provide a light emitting element which can easily make the light intensity variation of light emitting elements smaller, being miniaturized and being produced at a reduced cost, and an optical printer head using such light emitting element arrays, and a method for driving such an optical printer head.

A first aspect of the present invention is directed to a light emitting element array comprising a plurality of light emitting elements arranged in a row; switching elements connected in series with the respective light emitting elements and provided with control terminals for supplying emission signals to the respective light emitting elements; and an electrical driver for individually turning the respective switching elements on by individually supplying connection drive signals to the control terminals of the respective switching elements. The plurality of light emitting elements, switching elements, and the electrical driver are integrally formed in a semiconductor substrate.

In the light emitting element array thus constructed, since the switching elements connected in series are individually turned on, the lees connected therewith can be individually driven. Thus, when the switching elements are turned on, the emission signals, whose levels are so changed as to correspond to the respective light emitting elements, are supplied to the light emitting elements connected with these switching elements, thereby enabling an easy correction of a light intensity variation of the respective light emitting elements and an easy gradation control required for higher quality printing. Further, since the entire circuit construction is simpler as compared with the conventional ones, the light emitting element array can be made smaller and the production cost thereof can be reduced.

A second aspect of the present invention is directed to a light emitting element array comprising a plurality of light emitting elements arranged in a row and divided into a plurality of drive groups; switching elements connected in series with the respective light emitting elements of the respective drive groups, divided into a plurality of drive groups corresponding to those of the light emitting elements, and provided with control terminals for supplying emission signals to the respective light emitting elements; an electrical driver divided into a plurality of drive groups corresponding to those of the light emitting elements and adapted to individually turn the switching elements of the respective groups on at the same timings in each group by individually supplying connection drive signals to the control terminals of the switching elements of the respective drive groups in each drive group. The plurality of light emitting elements, the switching elements, and the electrical driver are integrally formed in a semiconductor substrate.

In the light emitting element array thus constructed, since the switching elements of the respective drive groups which are connected in series are individually turned on at the same timings in each drive group, the lees connected with these switching elements can be driven at the same timings in each drive group. Thus, when the switching elements of the respective groups are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing.

Further, since the entire circuit construction is simpler as compared with the conventional ones, the light emitting element array can be made smaller and the production cost thereof can be reduced. Furthermore, since the light emitting elements of the respective drive groups are driven in parallel at the same timings in each drive group, the light emitting elements can be driven at a higher speed, with the result that an optical printer head using these light emitting element arrays can print at a higher speed.

A third aspect of the present invention is directed to an optical printer head comprising a light emitting element array including a plurality of light emitting elements arranged in a row, switching elements connected in series with the respective light emitting elements and provided with control terminals for supplying emission signals to the respective light emitting elements and, and an electrical driver for individually turning the respective switcher on by individually supplying connection drive signals to the control terminals of the respective switching elements; and an emission controller for driving the electrical driver by supplying the connection drive signals thereto and individually driving the light emitting elements connected with the switching elements by supplying the emission signals thereto when these switching elements are individually turned on.

In the optical printer head thus constructed, the switching elements connected in series are individually turned on, and the lees connected with the turned-on switching elements are individually driven by supplying the emission signals thereof. Thus, when the switching elements are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing. Further, since the light emitting element array can be made smaller and the production cost thereof can be reduced, the optical printer head can be made smaller and the production cost thereof can be reduced.

A fourth aspect of the present invention is directed to an optical printer head comprising a plurality of light emitting elements arranged in a row and divided into a plurality of drive groups; switching elements connected in series with the respective light emitting elements of the respective drive groups, divided into a plurality of drive groups corresponding to those of the light emitting elements, and provided with control terminals for supplying emission signals to the respective light emitting elements; an electrical driver divided into a plurality of drive groups corresponding to those of the light emitting elements and adapted to individually turn the switching elements of the respective groups on at the same timings in each group by individually supplying connection drive signals to the control terminals of the switching elements of the respective drive groups in each drive group, and an emission controller for driving the electrical driver divided into the plurality of drive groups at the same timings in each drive group by supplying the connection drive signals to the electrical driver at the same timings in each group, and individually driving the light emitting elements of each drive group connected with the switching elements by supplying the emission signals thereto when these switching elements are individually driven at the same timings in each drive group.

In the inventive optical printer head thus constructed, the switching elements of the respective drive groups connected in series are individually turned on at the same timings in each drive group, and the lees connected with the turned-on switching elements are individually driven at the same timings in each group by supplying the emission signals thereto. Thus, when the switching elements of the respective groups are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing.

Further, since the light emitting element array can be made smaller and the production cost thereof can be reduced, the optical printer head can be made smaller and the production cost thereof can be reduced. Furthermore, since the light emitting elements of the respective drive groups are driven in parallel at the same timings in each drive group, the optical printer head can print at a higher speed.

A fifth aspect of the present invention is directed to a method for driving an optical printer head provided with a plurality of light emitting elements arranged in a row, comprising the steps of individually turning on a plurality of switching elements connected in series with the plurality of light emitting elements; and individually adjusting amounts of light emitted from the light emitting elements by supplying emission signals, whose levels are so changed as to correspond to the respective light emitting elements, to the light emitting elements connected with the switching elements when these switching elements are individually turned on.

According to this method, the light intensity variation of the respective lees can be easily corrected and the gradation control necessary for higher quality printing can be easily performed by a simple method. Further, since the lee array can be made smaller and the production cost thereof can be reduced by adopting this driving method, the optical printer head can be made smaller and the production cost thereof can be reduced.

These and other objects, features and advantages of the present invention will become more apparent upon a reading of the following detailed description and accompanying drawings.

DETAILED DESCRIPTION OF THE PREFERRED EMBODIMENTS OF THE INVENTION

As preferable embodiments of the invention, a light emitting element array, which is a semiconductor light emitting device, and an optical printer head constructed using such light emitting element arrays are described in detail with respect to the accompanying drawings. In these drawings, the shape, size and arrangement of the respective elements of the light emitting element array and structural bodies obtained during fabrication of the optical printer head are schematically shown to such a degree that the present invention can be understood.

Figure 1:
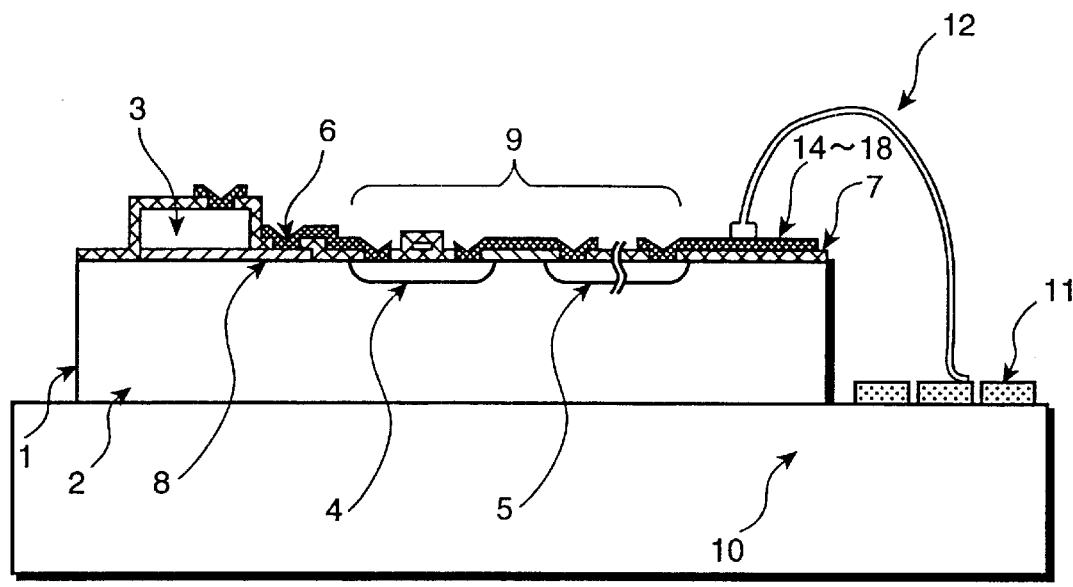
FIG. 1 is a section of an optical printer head according to a first embodiment of the invention.

FIG. 1 is a section showing an essential portion of an optical printer head constructed using light emitting element arrays according to a first embodiment of the present invention. The optical printer head according to the present invention is constructed by mounting a plurality of light emitting element arrays on a circuit board. In FIG. 1, a light emitting element array 1 which is a semiconductor light emitting device is comprised of a plurality of light emitting elements 3 which are light emitting diodes arranged in a line (in a row) on a silicon substrate 2, a plurality of output transistor circuits 4 including field-effect transistors as switching elements provided with control terminals which are provided in one-to-one correspondence with the light emitting elements 3 in order to control power application to the respective light emitting elements 3, shift register circuits 5 for controllably turning the respective output transistor circuits 4 on and off, etc. by the semiconductor fabrication technique. Driver circuits 9 for controlling driving of the light emitting diodes are constructed by the output transistor circuits 4 and the shift register circuit 5. It should be noted that the substrate may be made of gallium arsenide (GaAs), gallium nitride (GaN), and silicon carbide (SiC).

Instead of the field-effect transistors, bipolar transistors and like transistors may be used as the switching elements provided in correspondence with the respective light emitting elements 3. Further, electrode pads 14 to 18 connected with the output transistor circuits 4, the shift register circuit 5, etc. are formed on the silicon substrate 2 by a suitable means such as printing.

In the light emitting element array 1 thus constructed, after the driver circuits 9 comprised of the output transistor circuits 4 and the shift register circuit 5 are formed on the silicon substrate 2, a plurality of light emitting elements 3 are formed in a row. Finally, wiring portions 6, an insulation layer 7, a resistance layer 8, electrode pads 14 to 18, etc. are formed.

Specifically, the light emitting elements 3 are formed on the silicon substrate 2 after the driver circuits 9 are formed. The wiring portions 6 made of metallic thin films are formed after the driver circuits 9 formed of silicon semiconductors and the light emitting elements 3 formed of compound semiconductors are formed.

Since the silicon semiconductor is more resistant to thermal hysteresis than a light emitting element formed of a compound semiconductor, the driver circuits 9 are formed before the light emitting elements 3 are formed. Further, since the wiring portions 6 made of metallic thin films destroy circuits by their reaction with the semiconductors even at a low temperature of 400° C. or below, they are formed after the silicon conductor and the compound semiconductors are formed at a relatively high temperature.

The driver circuit 9 constructed by the output transistor circuits 4 and the shift register 5 which require fine wiring are suitably formed of silicon CMOS circuits whose fine processing technique is established and whose production cost are inexpensive. Further, a compound semiconductor having a high emission efficiency and a high reliability is suitably used as the light emitting element 3.

The silicon substrate 2 is formed by a known semiconductor fabrication technique, whereas the compound semiconductors are formed on the silicon substrate 2 by a two-stage growth method which is a known MOCVD (metalorganic chemical vapor deposition).

Since the driver circuits 9 are comprised of the output transistor circuits 4 and the shift register circuit 5 having a simple construction, the wiring portions 6 of the driver circuits 9 can be formed by at least one metallic thin film except wiring portions by a polysilicon. This can lead to reduced production cost and an improved reliability.

The switching elements forming the output transistor circuits 4 are formed of field-effect transistors including a CMOS, NMOS or PMOS. A suitable semiconductor device is selected according to the doping type of the silicon substrate 2, the diode characteristic of the light emitting elements 3 or whether a drive power is positive or negative. As described above, instead of the field-effect transistors, other switching elements such as bipolar transistors may be used.

Further, connection of cathode electrodes or anode electrodes of the light emitting elements 3 having a diode characteristic like a light emitting diode with the output transistor circuits 4 is suitably determined by a wiring layout, the structure of the output transistor circuits 4, and other factors. Specifically, since the field-effect transistor is formed as the switching element for the output transistor circuit 4 in this embodiment, a source, a drain and a gate of the field-effect transistor are connected with the anode of the light emitting element 3, a common power supply line connected with the anode of the light emitting element 3 and the shift register circuit 5 via a buffer, respectively. The cathodes of the light emitting elements 3 are all connected with a common line connected with a ground (GND).

The output transistor circuit 4 forming the driver circuit 9 may be formed of a compound semiconductor having a relatively high mobility. This enables miniaturization of the output transistor circuits 4. Further, the light emitting elements 3 may be formed using an inorganic or organic electroluminescent material.

The resistance layer 8 used to restrict a current may be omitted in the case that external drivers 19 (see FIG. 3) are provided with a current restricting function. Power supply lines for supplying power to the respective output transistor circuits 4 which lines form a multi-layer wiring structure are insulated from each other by an insulation film made of silicon oxide ($SiO_2$) or like material. Alternatively, they may be insulated by air bridges.

A plurality of light emitting element arrays 1 thus constructed are mounted on a circuit board 10, and the respective electrode pads 14 to 18 and a circuit pattern 11 formed on the circuit board 10 on which the external drivers are mounted by a suitable means such as printing are connected by bonding wires 12, thereby constructing an optical printer head. The circuit board 10 is made of an insulating material, such as alumina, glass, glass fabric coated with epoxy resin.

Figure 2:
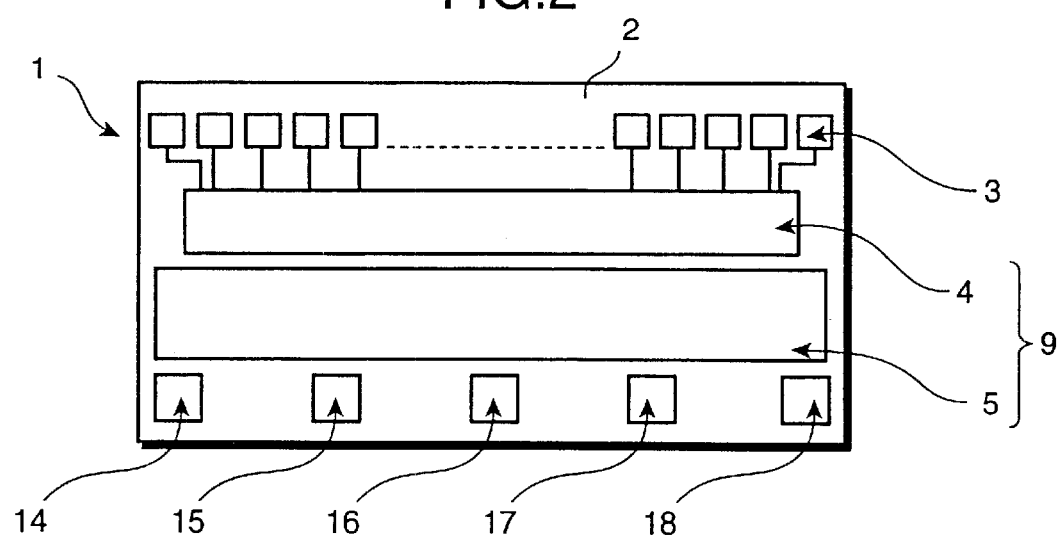
FIG. 2 is a plan view of a light emitting element array used in the optical printer head of FIG. 1.

FIG. 2 is a plan view showing one example of the circuit construction of the light emitting element array 1 according to the present invention. The light emitting element array 1 is comprised of three kinds of function elements (circuits): the light emitting elements 3, the output transistor circuits 4 and the shift register circuits 5.

The number of the electrode pads 14 to 18 can be reduced to five as in this embodiment. In such a case, the electrode pads 14, 15, 16, 17 and 18 are for the ground (GND), for a power supply to the driver circuits (VDD), for reset signals (RST), for block signals (BLK) and for light emitting element drive signals (I), respectively. In other words, the electrode pads 14 to 18 function as terminals for receiving four kinds of signals fed from the external drivers. Since the number of the electrode pads can be reduced to five in this embodiment, not only miniaturization and cost reduction of the light emitting element array 1, but also a remarkable reduction in mounting cost thereof on the circuit board 10 are enabled.

The silicon substrate 2 is rectangular, and a plurality of light emitting elements 3 are arranged along one longer side of the silicon substrate 2 while a plurality of electrode pads 14 to 18 are arranged along the other longer side. Accordingly, as shown in FIG. 1, the light emitting element array 1 and the circuit pattern 11 on the circuit board 10 are connected at one side, simplifying a mounting process.

In order to arrange the driver circuits 9 between the light emitting elements 3 and the electrode pads 14 to 18, the light emitting elements 3 and the electrode pads 14 to 18 are spaced apart by 200 $\mu$m or longer. This enables the lights emitted from the light emitting elements 3 to be less reflected by the bonding wires 12 connected with the electrode pads 14 to 18, and enables an improved printing quality.

A dimension in the longitudinal direction of the silicon substrate 2 in which the light emitting elements 3 are arranged in a row is referred to as a chip length while a dimension thereof in a direction normal to the longitudinal direction is referred to as a chip width. The chip length of the light emitting element array 101 thus constructed is determined by an arrangement pitch of the light emitting elements 3 corresponding to a printing resolution. Specifically, since the pitch is 42 $\mu$m at 600 dpi, 21 $\mu$m at 1200 dpi, the chip length is 5.4 mm at 600 dpi and 2.7 mm at 1200 dpi in the case that 128 light emitting elements 3 are arranged in a row.

A pitch per output of the output transistor circuits 4 and the shift register circuit 5 is substantially the same as that of the light emitting elements 3.

Figure 3:
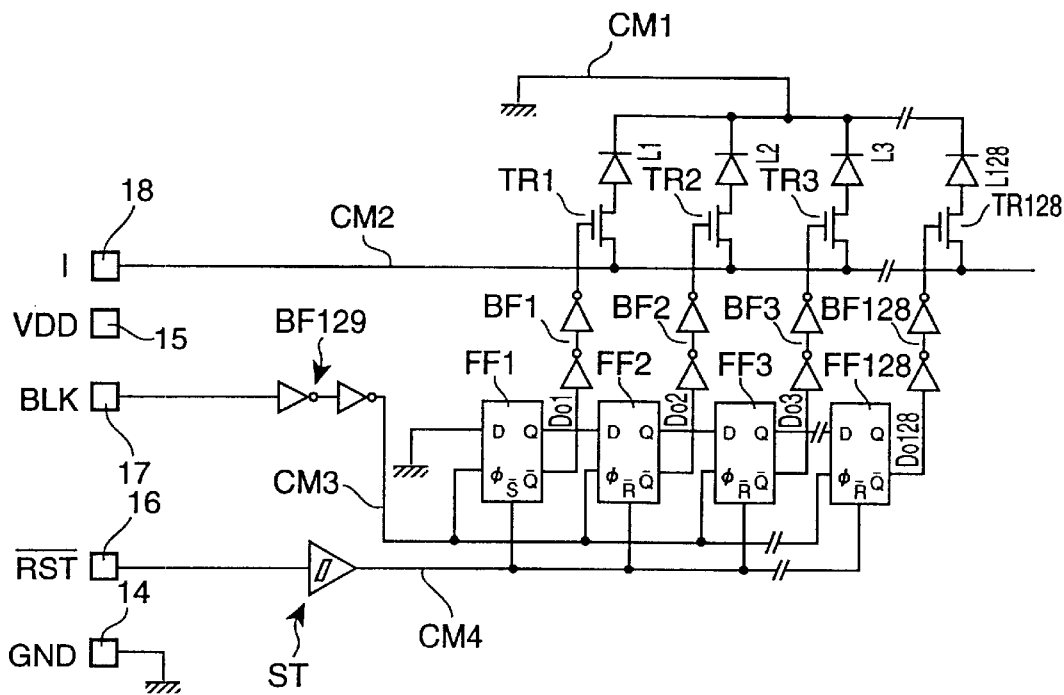
FIG. 3 is an equivalent circuit diagram of the optical printer head of FIG. 1.

FIG. 3 is an equivalent circuit diagram of the light emitting element array 1 shown in FIG. 2. Here, L1 to L128 denote the light emitting elements 3 formed of light emitting diodes and arranged in a row, and TR1 to TR128 denote field-effect transistors forming the output transistor circuits 4 connected with the respective light emitting elements L1 to L128. Further, BF1 to BF128 denote buffers connected with the field-effect transistors TR1 to TR128, and FF1 to FF128 denote flip-flops forming the shift registers 5 for supplying drive signals to the field-effect transistors TR1 to TR128. The field-effect transistors TR1 to TR128 are n-type-channel transistors in this embodiment, and are preferably provided with a back gate in view of operational stability.

The respective cathodes of the light emitting elements L1 to L128 are connected with a common line CM1 connected with the ground (GND), whereas the respective anodes thereof are connected with the sources of the field-effect transistors TR1 to TR128. The respective drains of the field-effect transistors TR1 to TR128 are connected with a second common line CM2 connected with the electrode pad 18 for the light emitting element drive signals (I), and the respective gates thereof are connected with Q-output terminals of the corresponding flip-flops FF1 to FF128 via the buffers BF1 to BF128.

The respective $\phi$-input terminals of the flop-flops FF1 to FF128 are connected with a third common line CM3 connected with the electrode pad 17 for the block signals (BLK) via a buffer BF129, whereas an S-input terminal of the flip-flop FF1 at the first stage and R-input terminals of the flip-flop FF2 to FF128 at the second and subsequent stages are connected with a fourth common line CM4 connected with the electrode pad 16 for reset signals (RST) via amplifiers.

The flip-flop FF1 at the first stage is a settable D-type flip-flop so that it is set by a reset signal (RST) and reset by the fall of a next block signal (BLK). The flip-flops FF2 to FF128 at the second and succeeding stages are resettable D-type flip-flops. Do1 to Do128 denote drive signals outputted from the Q-terminals of the flip-flop FF1 to FF128.

The drive signals Do1 to Do128 outputted from the respective flip-flop FF1 to FF128 are fed to the gates of the field-effect transistors TR1 to TR128 via the two-stage buffers BF1 to BF128 to drive the field-effect transistors TR1 to TR128 having a large output. However, these buffers BF1 to BF128 can be omitted by building buffer circuits in the Q-output terminals of the flip-flop FF1 to FF128, which makes the light emitting element array 1 smaller. Further, the electrode pads 16 and 17 preferably feed the reset signals and the block signals to the flip-flop FF1 to FF128 via protecting circuits for protecting from an excessively large voltage due to noise entering from the external drivers.

The electrode pad 14 for the ground (GND) and the electrode pad 15 for the driver circuit power supply (VDD) are connected with the shift register circuits 5 and the like forming the driver circuits 9 via an unillustrated wiring.

Figure 4:
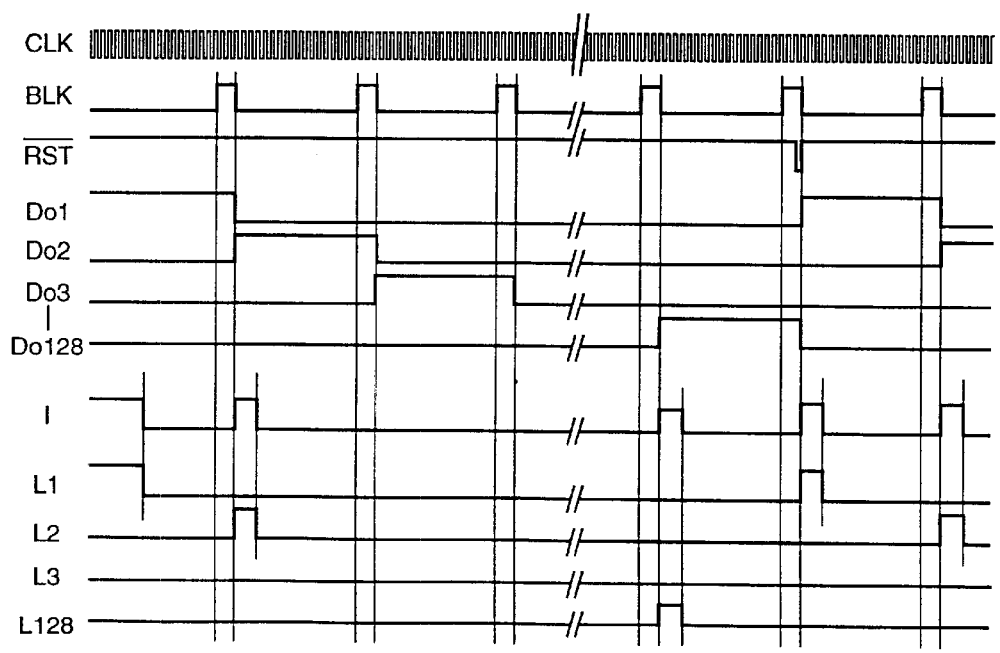
FIG. 4 is a chart showing signal sequences for the explanation of an operation of the optical printer head of FIG. 1.

FIG. 4 is a chart showing signal sequences for the explanation of an operation of the light emitting element array 1 having a circuit construction shown in FIG. 3.

Two kinds of signals: reset signal (RST) and block signal (BLK) are respectively inputted from the electrode pads 16 and 17 to the flip-flop FF1 to FF128 forming the shift register circuit 5. First, the flip-flop is set by the reset signal inputted from the electrode pad 16, and is reset by the fall of the block signal inputted from the electrode pad 17. Simultaneously with resetting, the flip-flop FF2 at the second stage is set and is reset by the fall of a next block signal.

Likewise, the flip-flops FF3 to FF128 at the third and subsequent stages are set at the same time the flip-flops at the previous stages are reset and are reset by the fall of the successively inputted block signals. The drive signals Do1 to Do128 are successively outputted from the respective Q-terminals by successively setting and resetting the flip-flops FF1 to FF128. In other words, the drive signals are outputted from the Q-terminals of the respective flip-flops FF1 to FF128 when the flip-flops FF1 to FF128 are set by the reset signals, and the output of the drive signals are stopped when they are reset by the fall of the block signals.

The respective field-effect transistors TR1 to TR128 are turned on by having their drains and the sources electrically connected only during a period during which the drive signals Do1 to Do128 are successively outputted from the flip-flops FF1 to FF128 and supplied to the gates of the field-effect transistors TR1 to TR128. Specifically, the shift register circuit 5 formed by the respective field-effect transistors TR1 to TR128 constructs a driver for selectively (or individually) electrically connecting the drains and the sources of the field-effect transistors TR1 to TR128 by successively supplying the drive signals to the gates of the field-effect transistors TR1 to TR128 which are control terminals in the arranged order of the respective light emitting elements L1 to L128.

On the other hand, light emitting element drive signals (image data) which are emission signals are supplied from the electrode pad 18 via the second common line CM2 synchronously when the respective field-effect transistors TR1 to TR128 are turned on, thereby successively driving the corresponding light emitting elements L1 to L128. Specifically, the image data serially supplied from the external drivers via the electrode pad 18 are converted into parallel image data, which are in turn distributed to the respective light emitting elements L1 to L128 to control the emission outputs of the light emitting elements L1 to L128.

The CLK signal shown in FIG. 4 is a clock signal generated in the external circuit for the synchronization of the enter operation.

A plurality of light emitting elements 3 (L1 to L128) are selectively (individually) driven one by one to emit light by varying a value of a current flowing in the second common line CM2 at the anode side in correspondence with the serial data inputted from the electrode pad 18 while successively turning a plurality of output transistor circuits 4 on and off by the drive signals from the shift register circuits 5.

Amounts of light emitted from the light emitting elements 3 are individually adjusted by adjusting the level (high level) of the current flowing in each light emitting element 3 or adjusting a power application period by a current having a specified value and flowing in each light emitting element 3, whereby a variation of light emission of the light emitting elements 3 is corrected and a gradation control necessary for higher quality printing is performed. As a result, light emission outputs corrected according to the variation and those gradation-controlled according to the image data can be obtained from the respective light emitting elements 3.

Although the light emission variation of the light emitting elements 3 is corrected and the gradation control is performed by adjusting the values of the currents flowing in the respective light emitting elements 3 and the power application periods in this embodiment, they may also be done by adjusting an amount of a current (current value×period) for each light emitting element 3 or adjusting the level or application period of a voltage applied to each light emitting element 3.

Further, although n-type-channel field-effect transistors are used to construct the output transistor circuits 4 in this embodiment, p-type-channel field-effect transistors may be used. In such a case, the anodes of the light emitting elements 3 may be connected with the first common line CM1 while the cathodes thereof may be connected with the second common line CM2 via the field-effect transistors. Further, in this case, the voltage of the second common line CM2 is set at low level. Although the field-effect transistors are connected between the anodes of the light emitting elements 3 and the second common line CM2 in this embodiment, they may be connected between the cathodes of the light emitting elements 3 and the first common line CM1. In such a case, a common line connected with the ground is referred to as a second common line CM2 while the one connected with the electrode pad 18 is referred to as a first common line CM1.

Figure 5:
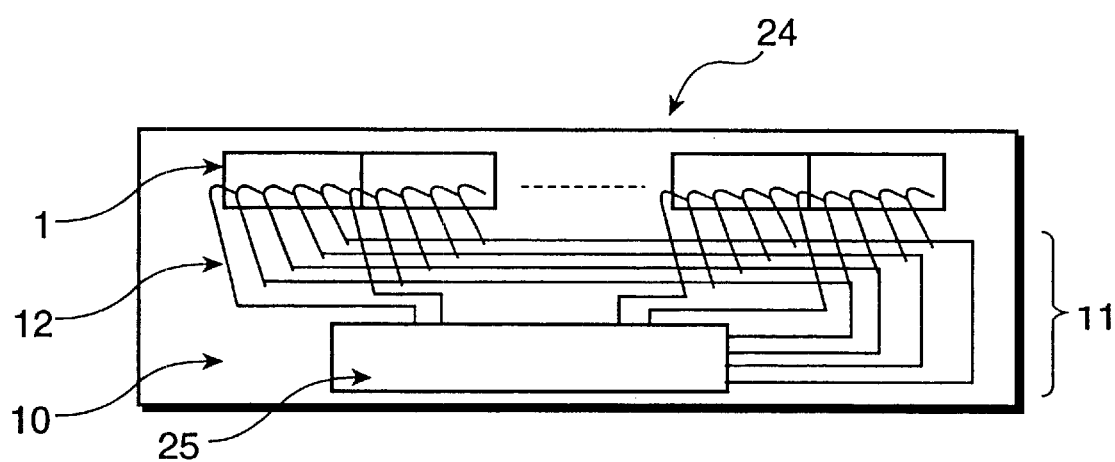
FIG. 5 is a block diagram showing a circuit construction of the optical printer head of FIG. 1.

FIG. 5 is a plan view showing the construction of an optical printer head 24 formed by mounting a plurality of light emitting element arrays 1 according to the first embodiment on the circuit board 10 on which an external driver 25 constituting an emission controller is mounted. Light emission of the light emitting elements 3 of the light emitting element arrays 1 are controlled by serial data (light emitting element drive signals) supplied from the external driver 25 having a light intensity variation correcting function and a gradation controlling function. The driver circuits 9 (see FIG. 1) for switching the respective light emitting elements 3 are driven in synchronism with the reset signals and the block signals from the external driver 25.

The external driver 25 is formed by integrating specified circuits on a semiconductor substrate. These specified circuits include, for example, a constant current output circuit for generating light emitting element drive signals to be supplied to the respective light emitting elements 3, a shift register for correcting a light intensity variation of the light emitting elements 3, correcting a current for the gradation control and correcting a time, an operation switching circuit for successively switching the light emitting element drive signals to be supplied to the light emitting elements 3 for each of the corresponding light emitting elements 3, and a clock counter for outputting clock signals.

The constant current output circuit simultaneously output a plurality of light emitting element drive signals to be supplied to a plurality of light emitting element arrays 1 constructing the optical printer head. A driver circuit power supply and a reset signal are respectively supplied from a control circuit provided at a previous stage of the external driver 25 to the electrode pad 14, the electrode pad 15 and the electrode pad 16 via the external driver 25. In the case that a voltage is applied to the light emitting element 3 as a light emitting element drive signal, a constant voltage output circuit may be used instead of the constant current output circuit.

The respective output terminals of the external driver 25 thus constructed are connected with the electrode pads 16 to 18 shown in FIG. 3, and the reset signal, the block signal, the light emitting element drive signal are outputted at timings shown in FIG. 4 to be supplied to the corresponding electrode pads 16 to 18. Here, correction values for the light emitting element drive signals to be supplied to the respective light emitting elements 3 are stored in correspondence with the light intensity variations of the respective light emitting elements 3 in a memory of, e.g., the control circuit provided at the previous stage. The light emitting element drive signals are supplied to the light emitting elements 3 after being corrected based on the stored correction values.

In the optical printer head 24 thus constructed, 5 bonding wires are used per light emitting element array 1 (1 chip) and the number of bonding wires 12 used for the connection with the circuit pattern 11 of the circuit board 10 can be reduced to $1/13$ to $1/26$ as compared with the conventional light emitting element array having 128 light emitting elements. Thus, a mounting cost can be significantly reduced, and the optical printer head can be made more inexpensive and more reliable.

The number of the electrode pads which take up a larger space than the circuit pattern 11 can likewise be reduced to $1/13$ to $1/26$. This enables a length of the shorter sides of the circuit board 10 to be significantly reduced and the optical printer head 24 to be less costly and to be made smaller.

As described above, one end of each of the light emitting elements 3 arranged in a row is connected with the first common line CM1 and the other end thereof is connected with the second common line CM2 via a switching element, so that the light emitting elements 3 can be selectively driven in the light emitting element array 1 according to the first embodiment and the optical printer head 24 constructed using such light emitting element arrays 1. Thus, the levels of the currents flowing in the respective light emitting elements 3 and the application periods thereof can be individually adjusted, and the levels of the voltages applied to the respective light emitting elements 3 and the application periods thereof can be individually adjusted. This enables an easy correction of the emission intensity variation of the light emitting elements 3 and an easy gradation control.

Further, the areas taken up by the driver circuits and the electrode pads, the number of bonding wires, and the number of external drivers can be respectively reduced, thereby reducing the production cost for the optical printer head and making the optical printer head smaller. Further, a mounting time is significantly reduced, enabling simplification of the optical printer head assembling operation. Furthermore, by spacing the electrode pads 14 to 18 of the light emitting element array 1 and the light emitting elements 3 thereof apart by a distance of 200 μm or longer, reflection of the lights emitted from the light emitting elements 3 by the bonding wires 12 and the like near the electrode pads 14 to 18 can be effectively prevented, thereby improving the reliability of the optical printer head.

Figure 6:
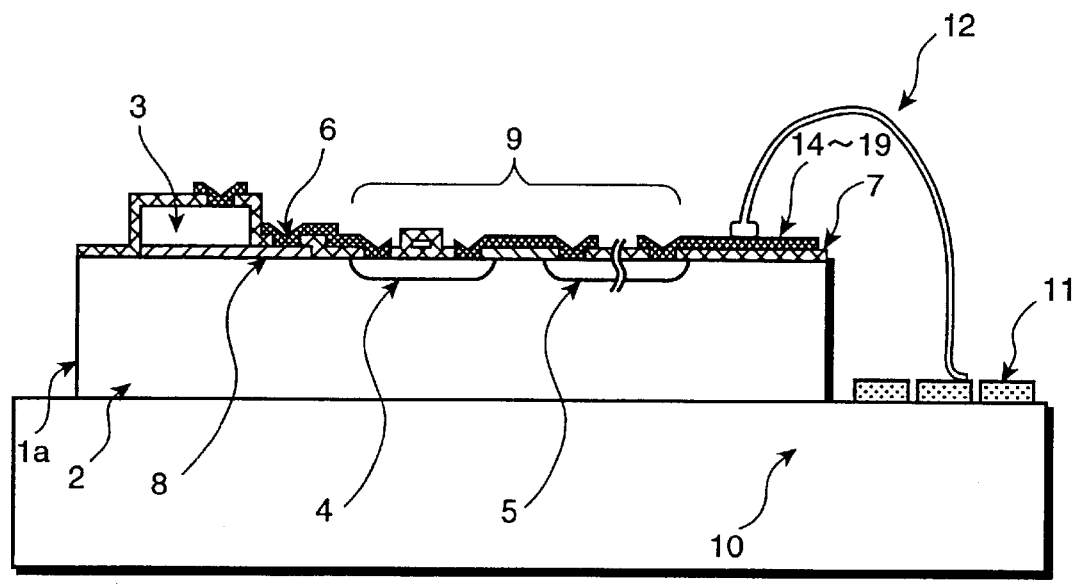
FIG. 6 is a section of an optical printer head according to a second embodiment of the present invention.
Figure 7:
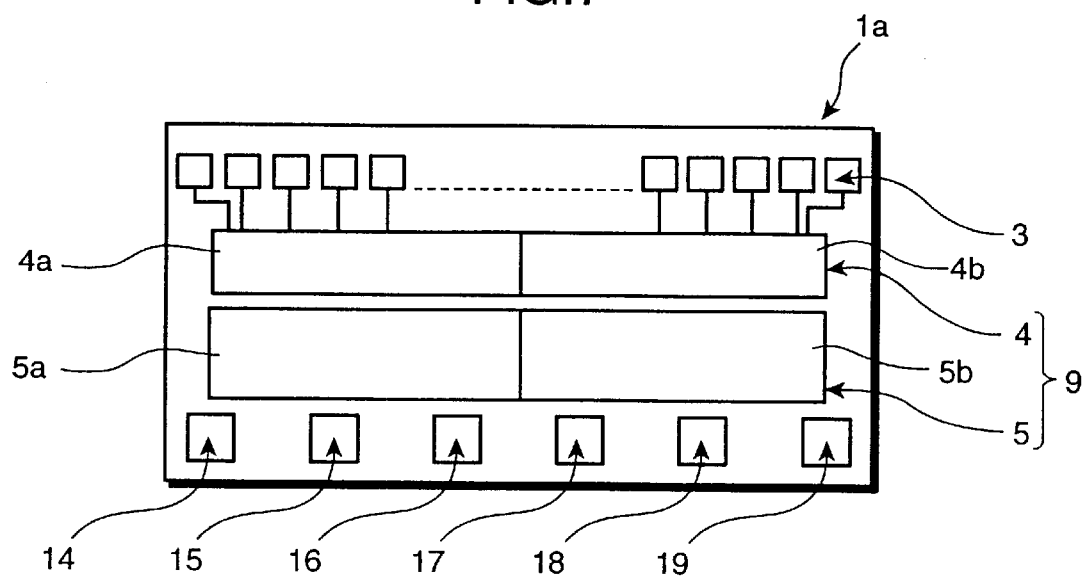
FIG. 7 is a plan view of a light emitting element array used in the optical printer head of FIG. 6.

FIG. 6 is a section showing an essential portion of an optical printer head constructed using light emitting element arrays according to a second embodiment of the present invention, and FIG. 7 is a plan view showing one example of the circuit construction of the light emitting element array according to the second embodiment. In FIGS. 6 and 7, no detailed description is given on the same elements as those of the first embodiment shown in FIGS. 1 and 2 by identifying them by the same reference numerals and the following description is centered on different points.

A light emitting element array 1a according to the second embodiment differs from the light emitting element array 1 according to the first embodiment in that the driver circuits including the output transistor circuits and the shift register circuits are divided into N groups (N is a natural number equal to or larger than 2) which operate in parallel, each group is connected with a common signal line, and the light emitting elements which can be driven by the driver circuits of each group are connected with different drive signal lines for the respective driver circuits of each group.

In other words, the light emitting element array 1a of the second embodiment is provided with a plurality of light emitting elements 3 which are light emitting diodes arranged in a line (in a row) on a silicon substrate 2, a plurality of output transistor circuits 4 including field-effect transistors provided to control power application to the respective light emitting elements 3, shift register circuits 5 for controllably turning the respective transistor circuits 4 on and off, electrode pads 14 to 19, etc. Driver circuits 9 including the output transistor circuits 4 and the shift register circuits 5 are divided into N groups (N is a natural number larger than 2) which operate in parallel. As a result, a plurality of light emitting elements 3 are also divided into N groups in correspondence with the divided driver circuits 9.

Specifically, in this embodiment, the output transistor circuits 4 and the shift register circuits 5 forming the driver circuits 9 are divided into two groups (i.e., N=2), one comprised of a first output transistor circuit 4a and a first shift register circuit 5a and the other comprised of a second output transistor circuit 4b and a second shift register circuit 5b. Two groups of the shift registers 5 are connected with a common signal line, so that the divided driver circuits 9 can operate in parallel group by group (i.e., can be simultaneously driven group by group). By driving the driver circuits 9 in parallel group by group, the light emitting elements 3 divided in correspondence with the divided driver circuits 9 are also driven in parallel group by group.

The number of the electrode pads 14 to 19 can be reduced to six as in this embodiment. In such a case, the electrode pads 14, 15, 16, 17, 18 and 19 are for the ground (GND), for a power supply to the driver circuits (VDD1), for reset signals (RST), for block signals (BLK), for a power supply to the driver circuits (VDD2) and for light emitting element drive signals (VDD3), respectively. In other words, the electrode pads 14 to 19 function as terminals for receiving the supply of five kinds of signals from external drivers.

The silicon substrate 2 is rectangular in shape similar to that of the first embodiment, and a plurality of light emitting elements 3 are arranged along one longer side of the silicon substrate 2 while a plurality of electrode pads 14 to 19 are arranged along the other longer side. Accordingly, as shown in FIG. 6, the light emitting element array 1a and the circuit pattern 11 on the circuit board 10 are connected at one side, simplifying a mounting process.

Further, in order to arrange the driver circuits 9 between the light emitting elements 3 and the electrode pads 14 to 19, the light emitting elements 3 and the electrode pads 14 to 19 are spaced apart by 200 μm or longer as in the first embodiment. This enables the lights emitted from the light emitting elements 3 to be less reflected by bonding wires 12 connected with the electrode pads 14 to 19, and enables an improved printing quality.

A plurality of light emitting element arrays 1a thus constructed are mounted on a circuit board 10, and the respective electrode pads 14 to 19 are connected via bonding wires 12 with a circuit pattern 11 on the circuit board 10 on which the external drivers are mounted, thereby constructing an optical printer head.

Figure 8:
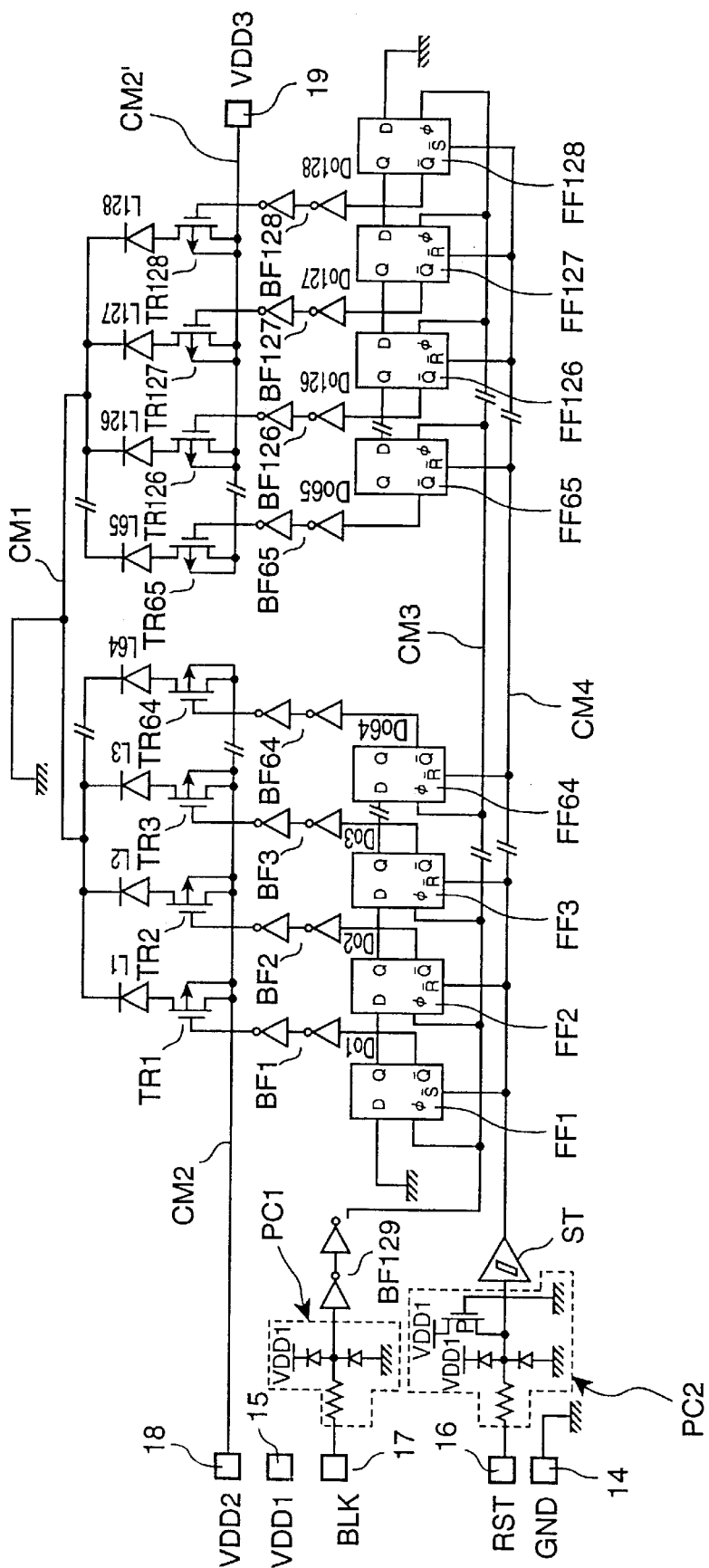
FIG. 8 is an equivalent circuit diagram of the optical printer head of FIG. 6.

FIG. 8 is an equivalent circuit diagram of the light emitting element array 1a shown in FIG. 7. Here, L1 to L128 denote the light emitting elements 3 formed of light emitting diodes and arranged in a row, and the light emitting elements L1 to L64 form a first group while the light emitting elements L65 to L128 forms a second group. In this embodiment, the light emitting elements L1 to L64 of the first group are successively driven in an increasing order from the light emitting element L1 toward the light emitting element L64, whereas the light emitting elements L65 to L128 of the second group are successively driven in an opposite direction from the first group from the light emitting element L128 toward the light emitting element L65.

TR1 to TR128 denote field-effect transistors forming the output transistor circuits 4 connected with the respective light emitting elements L1 to L128. The field-effect transistors TR1 to TR64 forms a first group (which forms the first output transistor circuit 4a), whereas the field-effect transistors TR65 to TR128 form a second group (which forms the second output transistor circuit 4b). The field-effect transistors TR1 to TR128 are n-type-channel transistors provided with a back gate in this embodiment.

BF1 to BF128 denote buffers connected with the field-effect transistors TR1 to TR128. The buffers BF1 to BF64 form a first group, whereas the buffers BF65 to BF128 form a second group.

FF1 to FF128 denote flip-flops forming the shift registers 5 for supplying drive signals to the field-effect transistors TR1 to TR128. The flip-flops FF1 to FF64 form a first group (which forms the first shift register circuit 5a), whereas the flip-flops FF65 to FF128 form a second group (which forms the second shift register circuit 5b).

The flip-flops FF1 to FF64 belonging to the first group are successively set in an increasing order from the flip-flop FF1 toward the flip-flop FF64, whereas the flip-flops FF65 to FF128 belonging to the second group are successively set in an opposite direction from the first group from the flip-flop FF128 toward the flip-flop FF65.

Specifically, the flip-flop FF1 is at the first stage and the flip-flop FF64 is at the last stage among the flip-flops FF1 to FF64 of the first group. Further, the flip-flop FF128 is at the first stage and the flip-flop FF65 is at the last stage among the flip-flops FF65 to FF128 of the second group.

The cathodes of the light emitting elements L1 to L64 of the first group and those of the light emitting elements L65 to L128 of the second group are connected with a first common line CM1 connected with the ground (GND), and the anodes of the light emitting elements L1 to L64 are connected with the respective drains of the field-effect transistors TR1 to TR64 of the first group and those of the light emitting elements L65 to L128 are connected with the respective drains of the field-effect transistors TR65 to TR128 of the second group. The respective sources of the field-effect transistors TR1 to TR64 of the first group are connected with one second common line CM2 connected with the first electrode pad 18 for the light emitting element drive signals, and those of the field-effect transistors TR65 to TR128 of the second group are connected with the other second common line CM2' connected with the second electrode pad 19 for the light emitting element drive signals.

Further, the respective gates of the field-effect transistors TR1 to TR64 of the first group are connected with Q-output terminals of the corresponding flip-flops FF1 to FF64 of the first group via the buffers BF1 to BF64 of the first group, whereas the respective gates of the field-effect transistors TR65 to TR128 of the second group are connected with Q-output terminals of the corresponding flip-flops FF65 to FF128 of the second group via the buffers BF65 to BF128 of the second group.

The respective φ-input terminals of the flip-flops FF1 to FF64 of the first group and those of the flip-flops FF65 to FF128 of the second group are connected with a common signal line CM3 connected with the electrode pad 17 for block signals (BLK) via a protecting circuit PC1 and a buffer BF129. The S-input terminal of the first flip-flop FF1 of the first group, that of the first flip-flop FF128 of the second group, the respective R-input terminals of the second and succeeding flip-flops FF2 to FF64 of the first group and those of the second and succeeding flip-flops FF127 to FF65 of the second group are connected with a common signal line CM4 connected with the electrode pad 16 for reset signals (RST) via a protecting circuit PC2 and a Schmitt trigger circuit ST.

The protecting circuits PC1, PC2 are for protecting the respective flip-flops FF1 to FF128 from application of an excessively large voltage created due to noise entering from the external drivers. These protecting circuits PC1, PC2 may not be necessarily required in the case the light emitting element array 1a is used in such an environment free from superimposition of noise.

The first flip-flop FF1 of the first group and the first flip-flop FF128 of the second group are settable D-type flip-flops so that they are set by reset signals (RST) and reset by the fall of next block signals (BLK). The second and succeeding flip-flops of the respective groups are resettable D-type flip-flops. Do1 to Do128 denote drive signals outputted from the Q-terminals of the flip-flops FF1 to FF128. The drive signals Do1 to Do128 outputted from the respective flip-flops FF2 to FF128 are supplied to the gates of the field-effect transistors TR1 to TR128 via the buffers BF1 to BF128 having a two-stage construction in order to drive the field-effect transistors TR1 to TR128 having a large output. However, the buffers BF1 to BF128 may be omitted by building buffer circuits in Q-output portions of the flip-flops FF1 to FF128, which enables miniaturization of the light emitting element array 1a.

Figure 9:
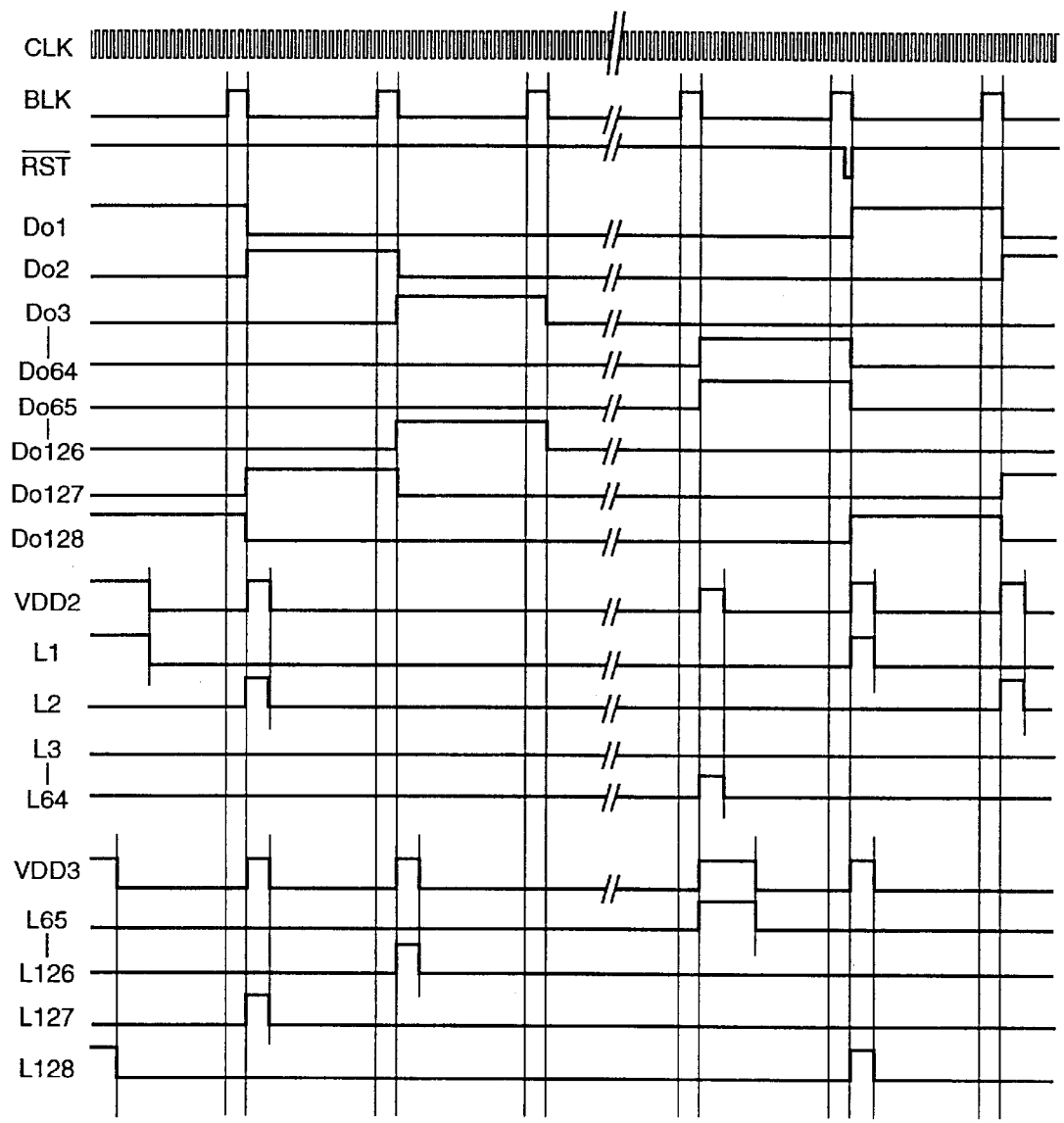
FIG. 9 is a chart showing signal sequences for the explanation of an operation of the optical printer head of FIG. 6.

FIG. 9 is a chart showing signal sequences for the explanation of an operation of the light emitting element array 1a having a circuit construction shown in FIG. 8.

Two kinds of signals, i.e., reset signals and block signals are respectively inputted from the electrode pad 16 and the electrode pad 17 to the flip-flops FF1 to FF64 of the first group and the flip-flops FF65 to FF128 of the second group forming the shift register circuits 5. First, the first flip-flop FF1 of the first group and the first flip-flop FF128 of the second group are simultaneously set by a reset signal inputted from the electrode pad 16 and simultaneously reset by the fall of a block signal inputted from the electrode pad 17. Simultaneously with resetting, the second flip-flop FF2 of the first group and the second flip-flop FF127 of the second group are simultaneously set and simultaneously reset by the fall of a next block signal.

Similarly, the third and succeeding flip-flops FF3 to FF64 of the first group and the third and succeeding flip-flops FF126 to FF65 of the second group are simultaneously set upon resetting of the previous flip-flops and simultaneously reset by the fall of block signals successively inputted. By successively setting and resetting the flip-flops FF1 to FF64 of the first group and the flip-flops FF65 to FF128 of the second group in parallel, the drive signals Do1 to Do64 and the drive signals Do65 to Do128 are successively outputted from the respective Q-output terminals. In other words, the flip-flops FF1 to FF128 of the respective groups output the drive signals Do1 to Do128 from their Q-output terminals when being set by the reset signals, and stop outputting the drive signals Do1 to Do128 when being reset by the fall of the block signals.

In this way, the drive signals Do1 to Do128 successively outputted in parallel from the flip-flops FF1 to FF64 of the first group and the flip-flops FF65 to FF128 of the second group are successively supplied in parallel to the gates of the field-effect transistors TR1 to TR64 of the first group and those of the field-effect transistors TR65 to TR128 of the second group. As a result, the field-effect transistors TR1 to TR128 of the respective groups are turned on by having the drains and sources thereof electrically connected during the supply period of the drive signals Do1 to Do128.

Specifically, the first shift register circuit 5a formed by the flip-flops FF1 to FF64 of the first group constructs a first driver for selectively (individually) electrically connecting the drains and sources of the respective field-effect transistors TR1 to TR64 by successively supplying the drive signals to the gates, i.e., control terminals of the field-effect transistors TR1 to TR64 of the first group in the arranging order of the respective light emitting elements L1 to L64. Further, the second shift register circuit 5b formed by the flip-flops FF128 to FF65 of the second group constructs a second driver for selectively (individually) electrically connecting the drains and sources of the respective field-effect transistors TR128 to TR65 by successively supplying the drive signals to the gates, i.e., control terminals of the field-effect transistors TR128 to TR65 of the second group in the arranging order of the respective light emitting elements L128 to L65.

On the other hand, synchronously with the ON-state of the field-effect transistors TR1 to TR64 of the first group, first light emitting element drive signals (image data) are supplied from the electrode pad 18 to the light emitting elements L1 to L64 connected with the field-effect transistors in their ON-state via the second common line CM2. Synchronously with the ON-state of the field-effect transistors TR128 to TR65 of the second group, second light emitting element drive signals (image data) are supplied from the electrode pad 19 to the light emitting elements L128 to L65 connected with the field-effect transistors in their ON-state via the other second common line CM2'. In this way, the light emitting elements L1 to L64 of the first group and the light emitting elements L65 to L128 of the second group are driven in parallel. In other words, the image data serially supplied from the external drivers via the electrode pads 18, 19 are converted into parallel image data, which are distributed to the respective light emitting elements L1 to L128 to control the emission outputs of the light emitting elements L1 to L128.

The CLK signal shown in FIG. 9 is a clock signal generated in the external driver or the like for the synchronization of the entire operation.

A plurality of light emitting elements 3 (L1 to L128) are selectively (individually) driven to emit light one by one in each group by varying the values of the currents flowing in the two second common lines CM2, CM2' at the anode side in correspondence with the serial data inputted from the electrode pads 18, 19 while the respective field-effect transistors of the first and second output transistor circuits 4a, 4b are successively switched on and off in parallel in each group by the drive signals from the first and second shift register circuits 5a, 5b.

Amounts of lights emitted from the light emitting elements 3 are individually adjusted by adjusting the level (high level) of the current flowing in each light emitting element 3 or adjusting a power application period by a current having a specified value and flowing in each light emitting element 3, whereby a variation of light emission of the light emitting elements 3 is corrected and a gradation control necessary for higher quality printing is performed. As a result, light emission outputs corrected according to the variation and those gradation-controlled according to the image data can be obtained from the respective light emitting elements 3.

Although the light emission variation of the light emitting elements 3 is corrected and the gradation control is performed by adjusting the values of the currents flowing in the respective light emitting elements 3 and the power application periods in this embodiment, they may also be done by adjusting an amount of a current (current value×period) for each light emitting element 3 or adjusting the level or application period of a voltage applied to each light emitting element 3.

Further, although n-type-channel field-effect transistors are used to construct the output transistor circuits 4 in this embodiment, p-type-channel field-effect transistors may be used. In such a case, the anodes of the light emitting elements 3 may be connected with the first common line CM1 while the cathodes thereof may be connected with the second common lines CM2, CM2' via the field-effect transistors. Further, in this case, the voltages of the second common lines CM2, CM2' are set at low level. Although the field-effect transistors are connected between the anodes of the light emitting elements 3 and the second common lines CM2, CM2' in this embodiment, they may be connected between the cathodes of the light emitting elements 3 and the first common line CM1. In such a case, a common line connected with the ground is referred to as a second common line CM2 while two common lines connected with the electrode pads 18, 19 are referred to as first common line CM1, CM1'.

Figure 10:
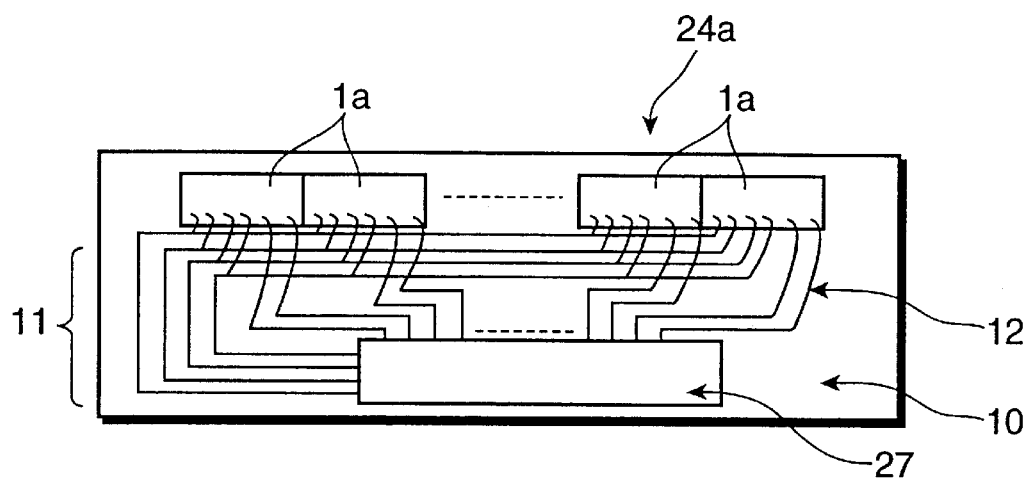
FIG. 10 is a block diagram showing a circuit construction of the optical printer head of FIG. 6.

FIG. 10 is a plan view showing the construction of an optical printer head 24a formed by mounting a plurality of light emitting element arrays 1a according to the second embodiment on the circuit board 10 on which an external driver 27 constituting an emission controller is mounted. Light emissions of the light emitting elements, 3 of the light emitting element arrays 1a are controlled by serial data (light emitting element drive signals) supplied from the external driver 27 having a light intensity variation correcting function and a gradation controlling function as described above. The driver circuits 9 (see FIG. 6) for switching the respective light emitting elements 3 are driven in synchronism with the reset signals and the block signals from the external driver 27.

The external driver 27 is constructed similar to the external driver 25 of the first embodiment, and the respective output terminals thereof are connected with the electrode pads 14 to 19 shown in FIG. 8. The driver circuit power supply, the reset signal, the block signal, the light emitting element drive signal, etc. are respectively supplied to the respective electrode pads 14 to 19 at timings shown in FIG. 9. Here, correction values for the light emitting element drive signals to be supplied to the respective light emitting elements 3 are stored in correspondence with the light intensity variations of the respective light emitting elements 3 in a memory of, e.g., a control circuit provided at a previous stage. The light emitting element drive signals are supplied to the light emitting elements 3 after being corrected based on the stored correction values.

In the optical printer head 21a thus constructed, 6 bonding wires are used per light emitting element array 1a (1 chip) and the number of bonding wires 12 used for the connection with the circuit pattern 11 of the circuit board 10 can be reduced to about 1/20 as compared with the conventional light emitting element array having 128 light emitting elements. Thus, a mounting cost can be significantly reduced, and the optical printer head can be made more inexpensive and more reliable.

Further, the number of the electrode pads which take up a larger space than the circuit pattern 11 can likewise be reduced to about 1/20. This enables a length of the shorter sides of the circuit board 10 to be significantly reduced and the optical printer head 24 to be less costly and to be smaller.

Figure 11A:
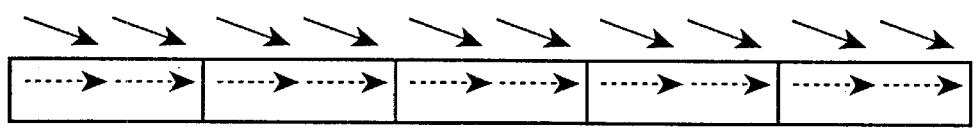
FIGS. 11A, 11B, 11C are diagrams showing a relationship between a direction in which light emitting elements are turned on and a printing direction.
Figure 11B:
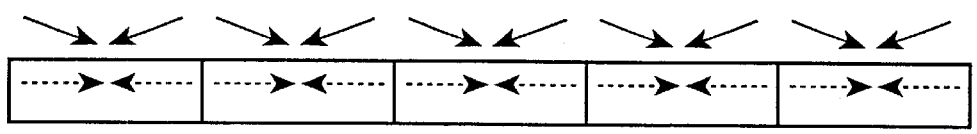
Figure 11C:
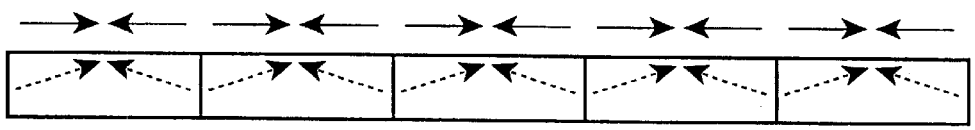

FIGS. 11A, 11B and 11C are diagrams showing a relationship between a direction in which the light emitting elements 3 provided on the light emitting element array 1a are turned on (turn-on direction) and a printing direction. It should be noted that the material to be printed is continuously fed in the direction perpendicularly intersecting the array arranging direction at a constant speed.

In the case that the light emitting elements 3 provided in the light emitting element array 1*a* are turned on in one direction as shown in FIG. 11A, only low-speed printing can be performed since printing shear between the divided groups becomes larger if printing is performed at a high speed.

In the case that the turn-on directions of the light emitting elements 3 of the two groups are opposed to each other as shown in FIG. 11B (i.e., in the case that the light emitting elements of the two groups are driven in directions opposite from each other as in this embodiment), high-speed printing can be performed since there is no printing shear between the divided groups.

Further, printing can be performed at an even higher speed if the turn-on directions of the light emitting elements 3 of the two groups are opposed as in the case of FIG. 11B and the light emitting elements 3 of the two groups are obliquely arranged with respect to main scanning direction so that printing directions are horizontal as shown in FIG. 11C. Accordingly, the light emitting elements 3 of the two groups may be obliquely arranged with respect to main scanning direction in the light emitting element array 1*a* according to the second embodiment.

In other words, in order to cause no printing shear to occur as shown in FIG. 11B or 11C, it is essential to simultaneously drive the light emitting elements of the adjacent groups arranged in laterally symmetrical positions with respect to a boundary between the groups.

As described above, in the light emitting element array 1*a* according to the second embodiment and in the optical printer head 24*a* constructed using the light emitting element arrays 1*a*, the light emitting elements 3 are selectively driven by connecting one end of each of the light emitting elements 3 arranged in a row with the first common line CM1 and connecting the other end thereof with the second common lines CM2, CM2' via the switching elements. Thus, the levels of the currents flowing in the respective light emitting elements 3 and the application periods can be individually adjusted or the levels of the voltages applied to the respective light emitting elements 3 and periods during which the applied voltages are held at a specified level can be individually adjusted. This enables an easy correction of the light intensity variation of the light emitting elements 3 and an easy gradation control. Further, the optical printer head can operate at a higher speed since a plurality of light emitting elements 3 arranged in a row are divided into two groups and the light emitting elements 3 of each group are driven in parallel.

Further, an area taken up by the driver circuits and the electrode pads, the number of bonding and the number of the external drivers are reduced, leading to a reduction in the production cost of the optical printer head, a smaller size, a significantly shortened mounting time, and a simplified assembling operation of the optical printer head. By spacing the electrode pads 14 to 19 of the light emitting element array 1*a* and the light emitting elements 3 thereof apart by a distance of 200 μm or longer, reflection of the lights emitted from the light emitting elements 3 by the bonding wires 12 and the like near the electrode pads 14 to 19 can be effectively prevented, thereby improving the reliability of the optical printer head.

Figure 12:
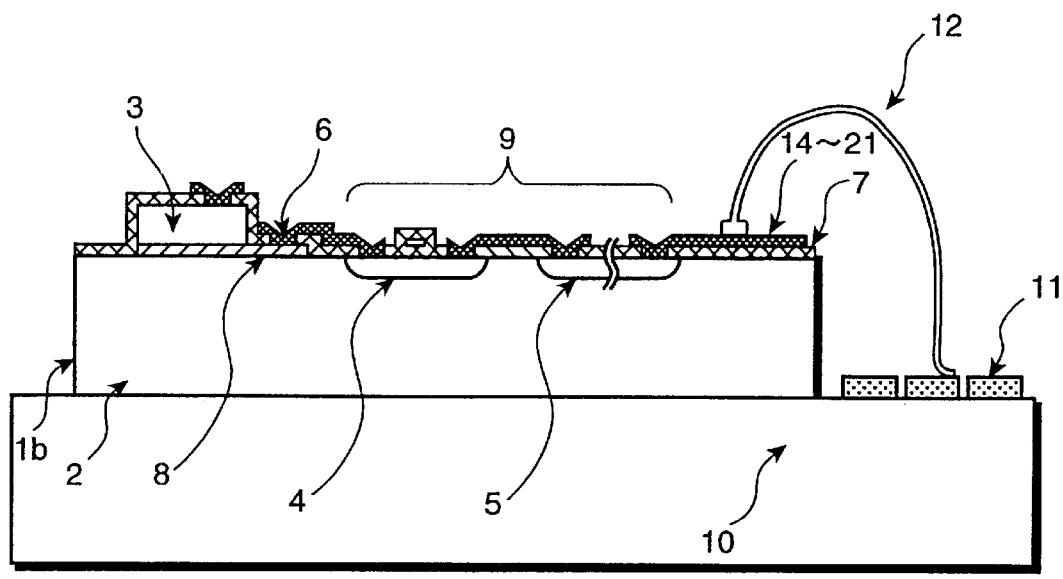
FIG. 12 is a section of an optical printer head according to a third embodiment of the present invention.
Figure 13:
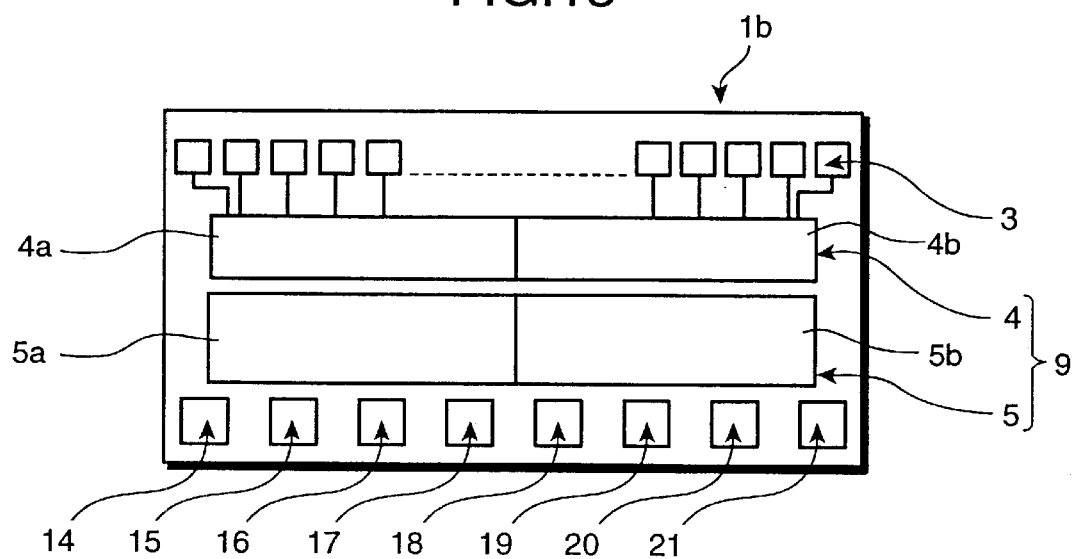
FIG. 13 is a plan view of a light emitting element array used in the optical printer head of FIG. 12.

FIG. 12 is a section showing an essential portion of an optical printer head constructed using light emitting element arrays 1*b* according to a third embodiment of the present invention, and FIG. 13 is a plan view showing one example of the circuit construction of the light emitting element array 1*b*. In FIGS. 12 and 13, no detailed description is given on the same elements as those of the second embodiment shown in FIGS. 6 and 7 (or of the first embodiment shown in FIGS. 1 and 2) by identifying them by the same reference numerals and the following description is centered on different points.

The light emitting element array 1*b* according to the third embodiment differs from the light emitting element array 1*a* according to the second embodiment in that drive signals of the shift register circuits 5 of the respective groups are commonly supplied to M (natural number equal to or larger than 2) output transistor circuits 4 in the respective groups, and these M output transistor circuits 4 are connected with drive signal lines different from each other.

In other words, the light emitting element array 1*b* of the third embodiment is provided with a plurality of light emitting elements 3 which are light emitting diodes arranged in a line (in a row) on a silicon substrate 2, a plurality of output transistor circuits 4 including field-effect transistors provided to control power application to the respective light emitting elements 3, shift register circuits 5 for controllably turning the respective transistor circuits 4 on and off, electrode pads 14 to 21, etc. Driver circuits 9 including the output transistor circuits 4 and the shift register circuits 5 are divided into N groups (N is a natural number equal to or larger than 2) which operate in parallel, the drive signals of the shift register circuits 5 of the respective groups are commonly supplied to the M (natural number equal to or larger than 2) output transistor circuits 4 in the respective groups, and these M output transistor circuits 4 are connected with the drive signal lines different from each other. As a result, a plurality of light emitting elements 3 are also divided into N groups in correspondence with the divided driver circuits 9, and the light emitting elements 3 connected with the M output transistor circuits 4 in the respective groups can be simultaneously driven.

Specifically, in this embodiment, the output transistor circuits 4 and the shift register circuits 5 forming the driver circuits 9 are divided into two groups (i.e., N=2), one comprised of a first output transistor circuit 4*a* and a first shift register circuit 5*a* and the other comprised of a second output transistor circuit 4*b* and a second shift register circuit 5*b*. Two groups of the shift registers 5 are connected with a common signal line, so that the divided driver circuits 9 can operate in parallel group by group (i.e., can be simultaneously driven in each group). Further, the first and second output transistor circuits 4*a*, 4*b* are simultaneously driven two by two in each group (i.e., M=2). By driving the driver circuits 9 in parallel group by group, the light emitting elements 3 divided in correspondence with the divided driver circuits 9 are also driven in parallel group by group and the light emitting elements 3 are simultaneously driven two by two.

The number of the electrode pads 14 to 21 can be reduced to eight as in this embodiment. In such a case, the electrode pads 14, 15, 16, 17, 18, 19, 20 and 21 are for the ground (GND), for a power supply to the driver circuits (VDD), for reset signals (RST), for block signals (BLK), for first light emitting element drive signals (VDD11), for second light emitting element drive signals (VDD12), for third light emitting element drive signals (VDD21), and for fourth light emitting element drive signals (VDD22), respectively. In other words, the electrode pads 14 to 21 function as terminals for receiving the supply of seven kinds of signals from external drivers.

If a spacing between the light emitting elements 3 and the electrode pads 14 to 21 is set at 200 μm or longer as in the first and second embodiments, reflection of lights emitted from the light emitting elements 3 by the bonding wires 12 can be reduced and printing quality can be improved.

A plurality of light emitting element arrays 1b thus constructed are mounted on a circuit board 10, and the respective electrode pads 14 to 21 are connected via the bonding wires 12 with a circuit pattern 11 on the circuit board 10 on which the external drivers are mounted, thereby constructing an optical printer head.

Figure 14:
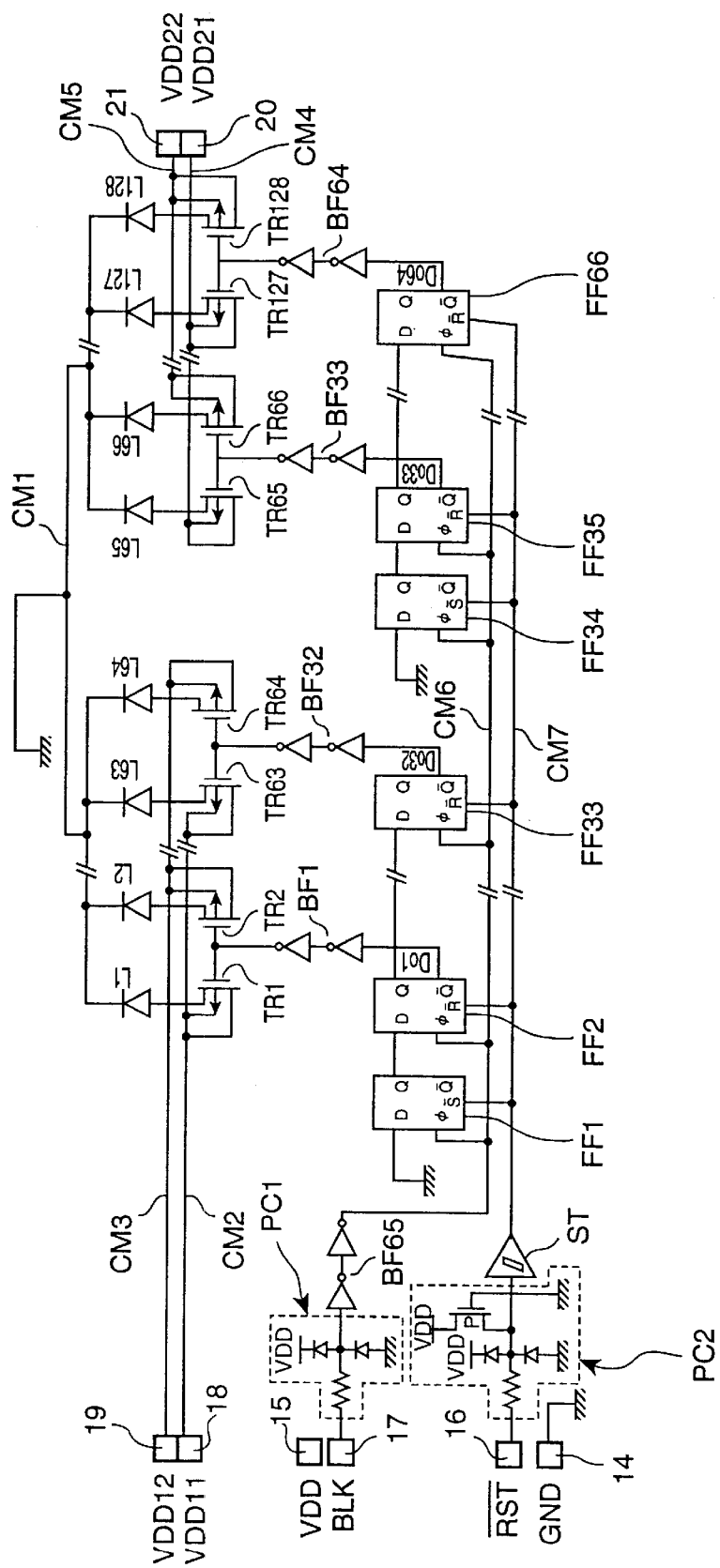
FIG. 14 is an equivalent circuit diagram of the optical printer head of FIG. 12.

FIG. 14 is an equivalent circuit diagram of the light emitting element array 1b shown in FIG. 13. Here, light emitting elements L1 to L64 form a first group and light emitting elements L65 to L128 form a second group. Pairs of adjacent ones of the light emitting elements L1 to L64, L65 to L128 of the respective groups are successively driven one by one.

Further, flip-flops FF1 to FF33 form a first group and flip-flops FF34 to FF66 forms a second group. The flip-flops FF1 to FF33 of the first group are successively set in an increasing order from FF1 to FF33, and the flip-flops FF34 to FF66 of the second group are also successively set in an increasing order from FF34 to FF66.

Here, the respective cathodes of the light emitting elements L1 to L64 of the first group and those of the light emitting elements L65 to L128 of the second group are connected with a first common line CM1 connected with a ground (GND), whereas the respective anodes thereof are connected with the respective sources of field-effect transistors TR1 to TR64 of the first groups and those of field-effect transistors TR65 to TR128 of the second group.

The respective drains of the odd-numbered ones of the field-effect transistors TR1 to TR64 of the first group are connected with a second common line CM2 connected with the electrode pad 18 for first light emitting element drive signals, and those of the even-numbered ones thereof are connected with a third common line CM3 connected with the electrode pad 19 for third light emitting element drive signals.

The respective drains of the odd-numbered ones of the field-effect transistors TR65 to TR128 of the second group are connected with a fourth common line CM4 connected with the electrode pad 20 for third light emitting element drive signals, and those of the even-numbered ones thereof are connected with a fifth common line CM5 connected with the electrode pad 21 for fifth light emitting element drive signals.

Further, the respective gates of pairs of adjacent ones of the field-effect transistors TR1 to TR64 of the first group are connected one by one with Q-output terminals of the flip-flops FF2 to FF33 of the first group via buffers BF1 to BF32 of the first group, and those of pairs of adjacent ones of the field-effect transistors TR65 to TR128 of the second group are connected one by one with Q-output terminals of the flip-flops FF35 to FF66 of the second group via buffers BF33 to BF64 of the second group.

The respective φ-input terminals of the flip-flops FF1 to FF33 of the first group and those of the flip-flops FF34 to FF66 of the second group are connected with a sixth common line CM6 connected with the electrode pad 17 for block signals (BLK) via a protecting circuit PC1 and a buffer BF65. An S-input terminal of the first flip-flop FF1 of the first group, that of the first flip-flop FF34 of the second group, the respective R-input terminals of the second and succeeding flip-flops FF2 to FF33 of the first group and those of the second and succeeding flip-flops FF35 to FF66 of the second group are connected with a seventh common line CM7 connected with the electrode pad 16 for reset signals (RST) via a protecting circuit PC2 and a Schmitt trigger circuit ST.

The first flip-flop FF1 of the first group and the first flip-flop FF34 of the second group are settable D-type flip-flops so that they are set by reset signals (RST) and reset by the fall of next block signals (BLK). The second and succeeding flip-flops of the respective groups are resettable D-type flip-flops.

Figure 15:
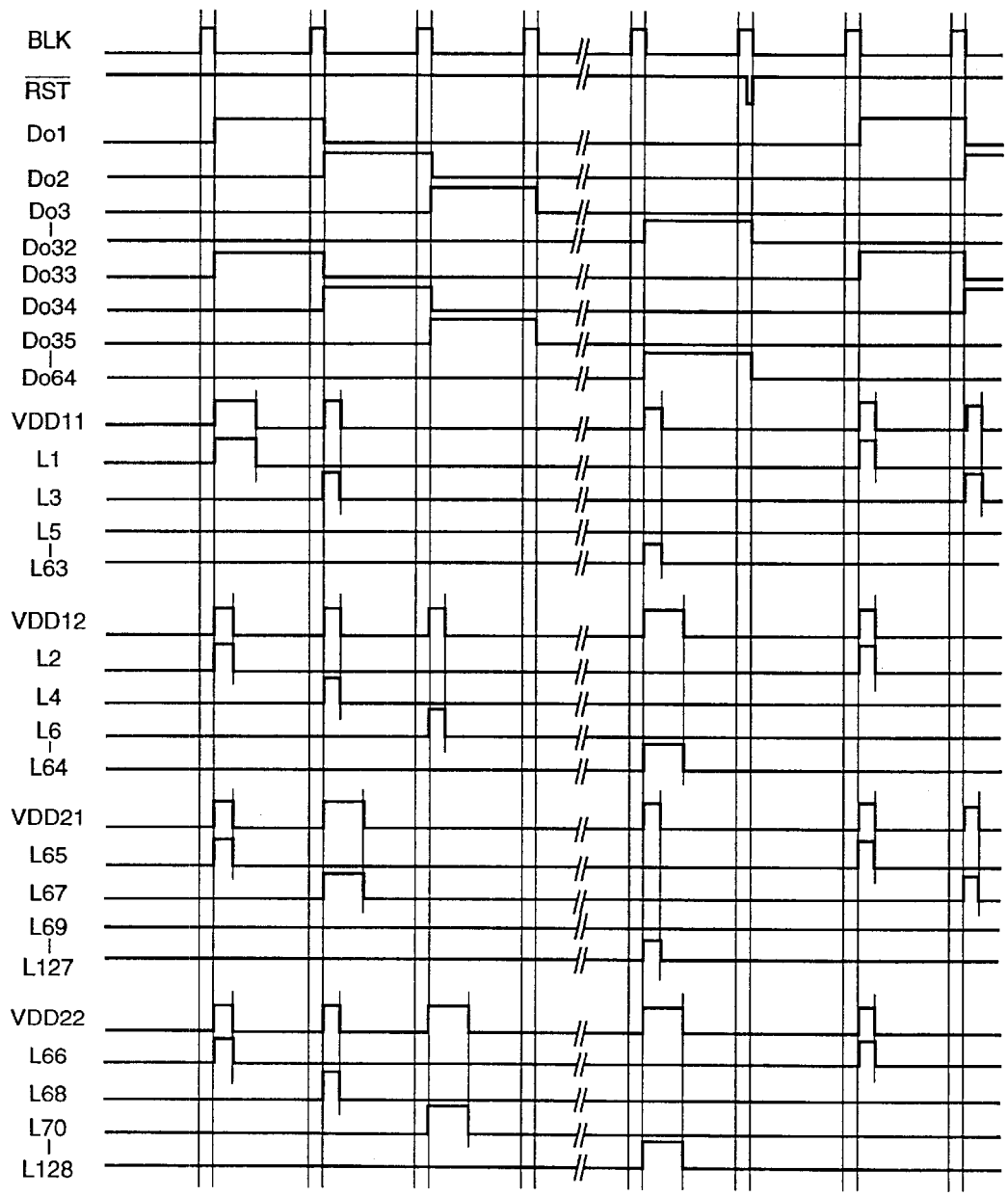
FIG. 15 is a chart showing signal sequences for the explanation of an operation of the optical printer head of FIG. 12.

FIG. 15 is a chart showing signal sequences for the explanation of an operation of the light emitting element array 1b having a circuit construction as shown in FIG. 14.

First, the first flip-flops FF1 and FF34 of the first and second groups forming the shift register circuits 5 are simultaneously set by a reset signal inputted from the electrode pad 16 and simultaneously reset by the fall of a block signal inputted from the electrode pad 17. Simultaneously with resetting, the second flip-flop FF2 of the first group and the second flip-flop FF127 of the second group are simultaneously set and simultaneously reset by the fall of a next block signal.

Similarly, the third and succeeding flip-flops FF3 to FF33 of the first group and the third and succeeding flip-flops FF34 to FF66 of the second group are simultaneously set upon resetting of the previous flip-flops and simultaneously reset by the fall of block signals successively inputted. By successively setting and resetting the flip-flops FF1 to FF33 of the first group and the flip-flops FF34 to FF66 of the second group in parallel, drive signals Do1 to Do32 and drive signals Do33 to Do64 are successively outputted from the respective Q-output terminals. In other words, the flip-flops FF2 to FF33, FF35 to FF66 of the respective groups output the drive signals Do1 to Do32, Do33 to Do64 from their Q-output terminals when being set by the reset signals, and stop outputting the drive signals Do1 to Do32, Do33 to Do64 when being reset by the fall of the block signals.

In this way, the drive signals Do1 to Do32, Do33 to Do64 successively outputted in parallel from the flip-flops FF1 to FF33 of the first group and the flip-flops FF34 to FF66 of the second group are successively supplied in parallel to the gates of pairs of adjacent ones of the field-effect transistors TR1 to TR64 of the first group and those of pairs of adjacent ones of the field-effect transistors TR65 to TR128 of the second group. As a result, pairs of adjacent ones of the field-effect transistors TR1 to TR128 of the respective groups are turned on one by one by having the drains and sources thereof electrically connected during the supply period of the drive signals Do1 to Do33, Do33 to Do64.

Specifically, the first shift register circuit 5a formed by the flip-flops FF1 to FF33 of the first group constructs a first driver for selectively electrically connecting the drains and sources of pairs of the respective field-effect transistors TR1 to TR64 by successively supplying the drive signals to the gates of the field-effect transistors TR1 to TR64 of the first group in the arranging order of the respective light emitting elements L1 to L64. Further, the second shift register circuit 5b formed by the flip-flops FF34 to FF66 of the second group constructs a second driver for selectively electrically connecting the drains and sources of pairs of the respective field-effect transistors TR65 to TR128 by successively supplying the drive signals to the gates of the field-effect transistors TR65 to TR128 of the second group in the arranging order of the respective light emitting elements L65 to L128.

On the other hand, synchronously with the ON-state of pairs of the field-effect transistors TR1 to TR64 of the first group, first and second light emitting element drive signals (image data) are supplied from the electrode pads 18, 19 to corresponding pairs of the light emitting elements L1 to L64. Synchronously with the ON-state of pairs of the field-effect transistors TR65 to TR128 of the second group, third and fourth light emitting element drive signals (image data) are supplied from the electrode pad 20, 21 to corresponding pairs of the light emitting elements L65 to L128. In this way, the respective pairs of the light emitting elements L1 to L64 of the first group and the respective pairs of the light emitting elements L65 to L128 of the second group are driven in parallel. In other words, the image data serially supplied from the external drivers via the electrode pads 18, 19, 20, 21 are converted into parallel image data, which are distributed to the respective light emitting elements L1 to L128 to control the emission outputs of the light emitting elements L1 to L128.

In this way, pairs of a plurality of light emitting elements 3 (L1 to L128) are selectively (individually) driven one by one to emit light in each group by varying, for example, the values of the currents flowing in the four common lines CM2 to CM5 at the anode side in correspondence with the serial data inputted from the electrode pads 18, 19, 20, 21 while successively switching pairs of the field-effect transistors of the first and second output transistor circuits 4a, 4b on and off in parallel one by one in each group by the drive signals from the first and second shift register circuits 5a, 5b.

Specifically, amounts of light emitted from the light emitting elements 3 are individually adjusted by adjusting the level (high level) of the current flowing in each light emitting element 3 or adjusting or adjusting the application period by the current flowing in each light emitting element 3 and having a specific value while the light emitting elements 3 are emitting light, whereby a variation of light emission of the light emitting elements 3 is corrected and a gradation control necessary for higher quality printing is performed. As a result, light emission outputs corrected according to the variation and those gradation-controlled according to the image data can be obtained from the respective light emitting elements 3. At this time, since pairs of the light emitting elements 3 in each group are driven in parallel one by one, the optical printer head can operate at an even higher speed.

Further, since a plurality of output transistor circuits are controllably turned on and off by the driven signals from one flip-flop in the shift register circuits 5, the number of the shift register circuits. 5 can be reduced as compared to that of the light emitting elements 3. Therefore, a driving circuit unit and the chip can be made smaller, and the chip can be made more inexpensive.

Although the light emission variation of the light emitting elements 3 is corrected and the gradation control is performed by adjusting the values of the currents flowing in the respective light emitting elements 3 and the power application periods in this embodiment, they may also be done by adjusting an amount of a current (current value×period) for each light emitting element 3 or adjusting the level or application period of a voltage applied to each light emitting element 3.

Figure 16:
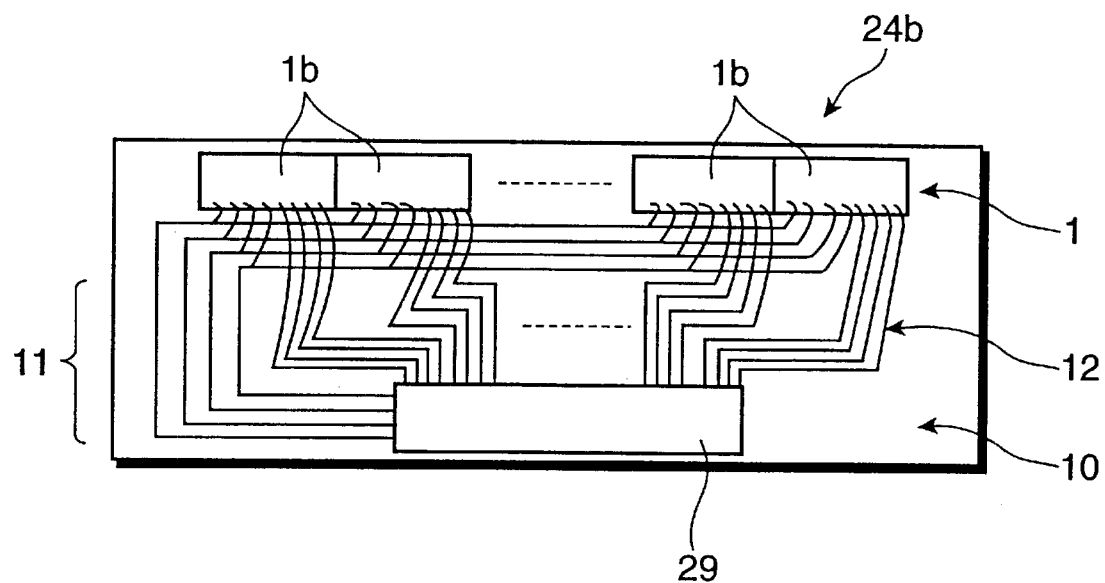
FIG. 16 is a block diagram showing a circuit construction of the optical printer head of FIG. 12.
Figure 17:
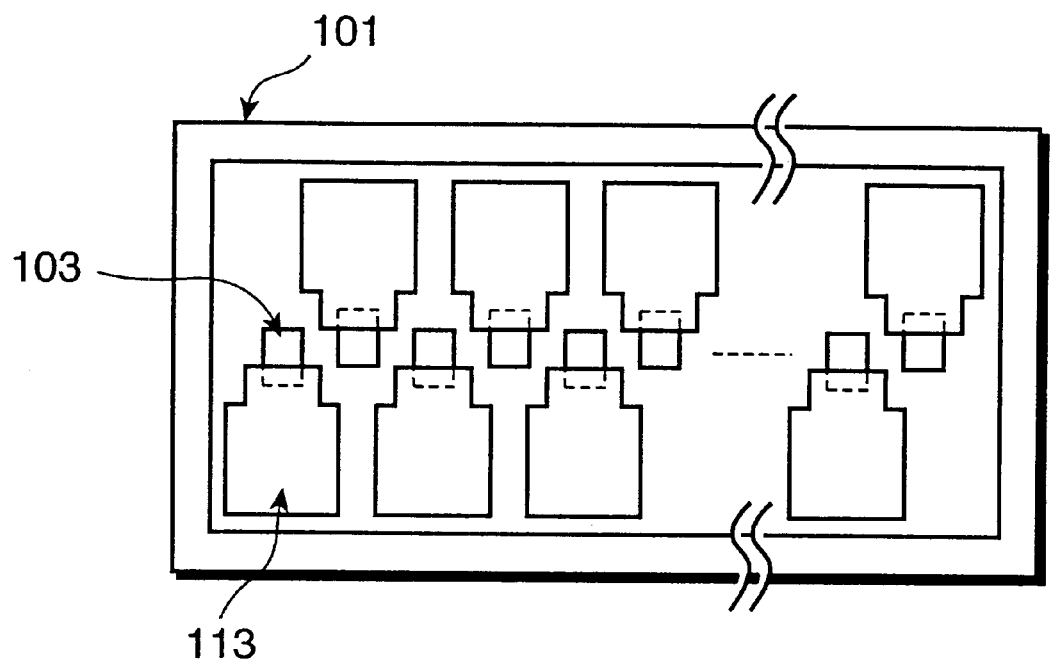
FIG. 17 is a plan view of a first conventional light emitting element array.
Figure 18:
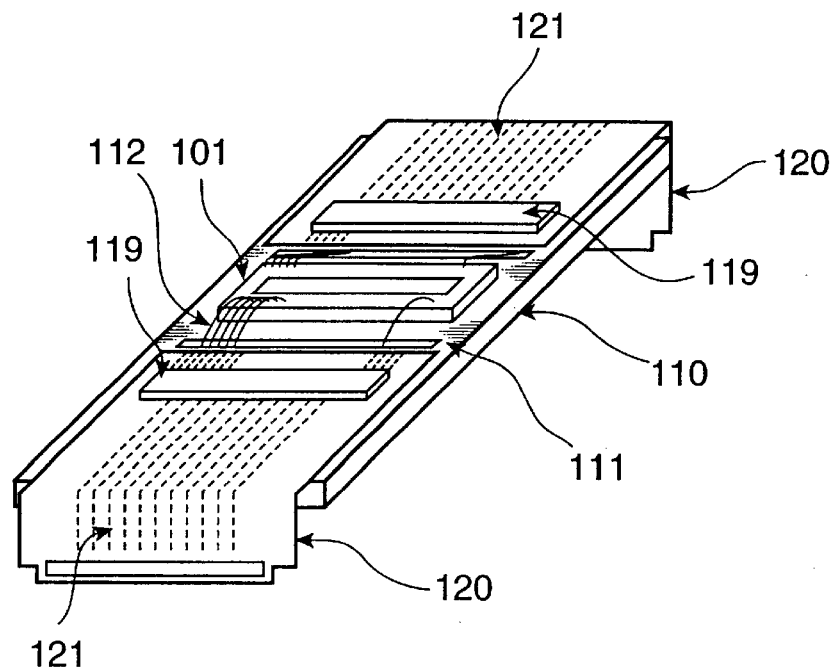
FIG. 18 is a perspective view showing a first conventional optical printer head constructed using the light emitting element arrays shown in FIG. 17.
Figure 19:
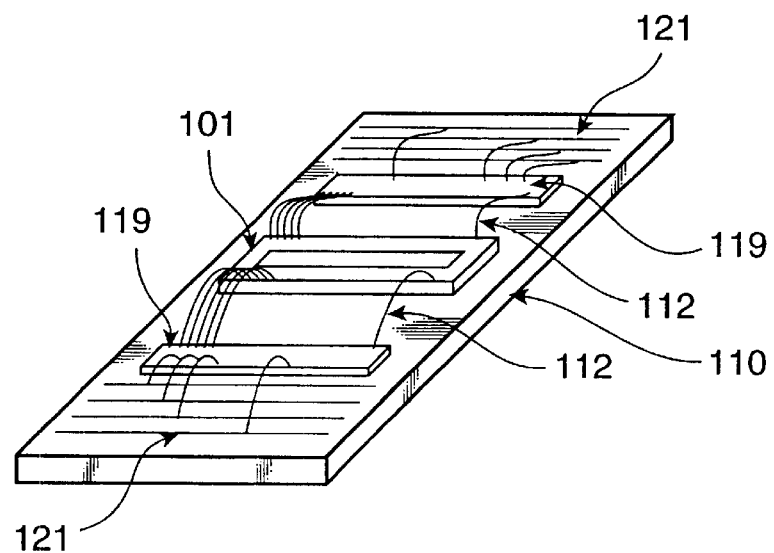
FIG. 19 is a perspective view showing a second conventional optical printer head.
Figure 20:
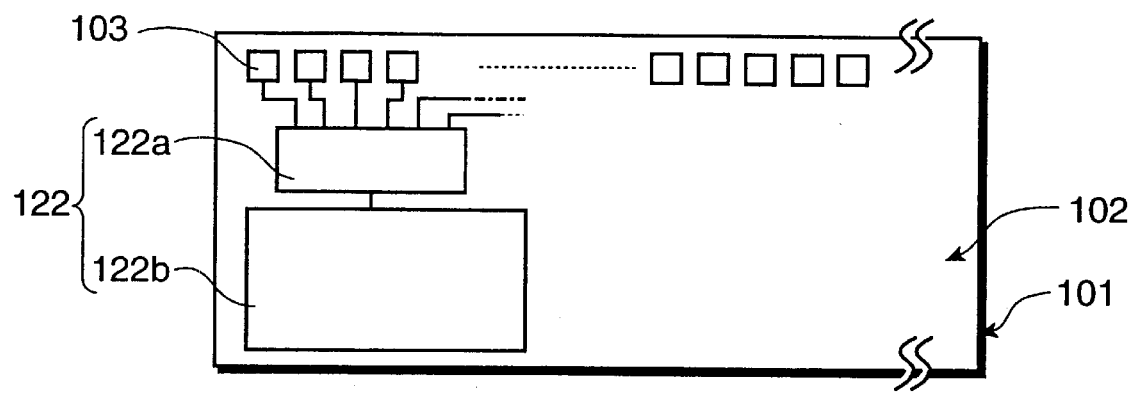
FIG. 20 is a plan view of a second conventional light emitting element array.
Figure 21:
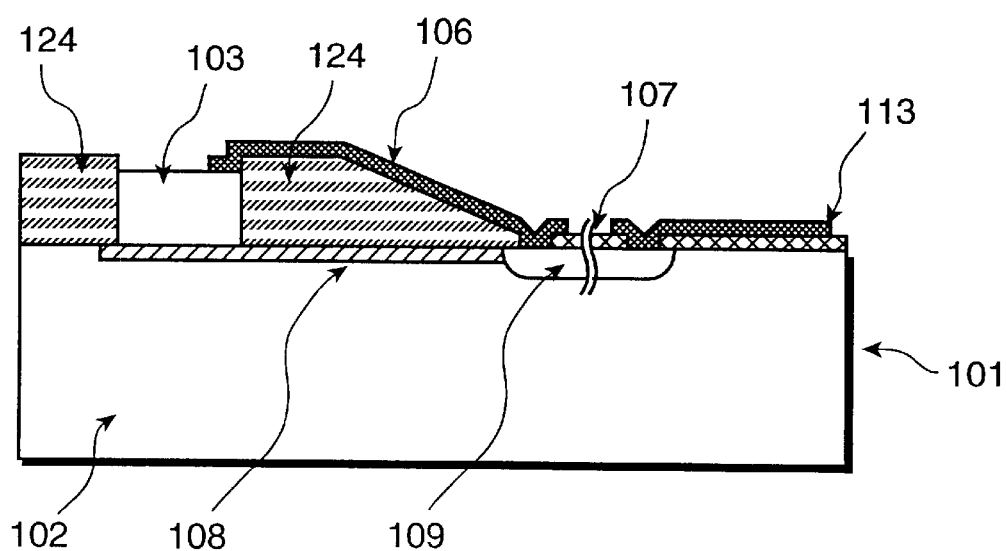
FIG. 21 is a section of a third conventional light emitting element array.
Figure 22:
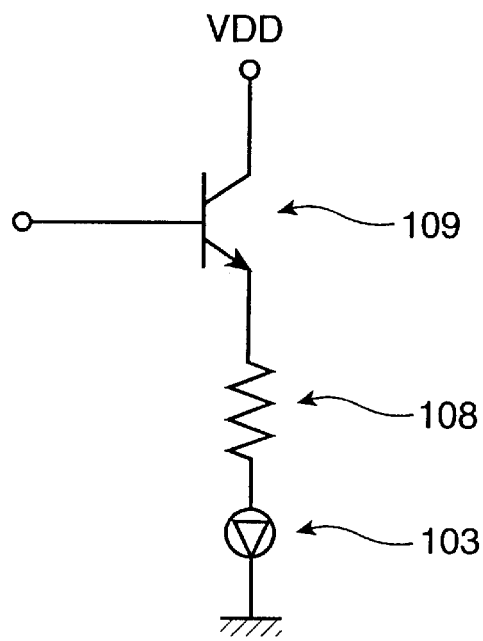
FIG. 22 is an equivalent circuit diagram of the light emitting element array shown in FIG. 21.
Figure 23:
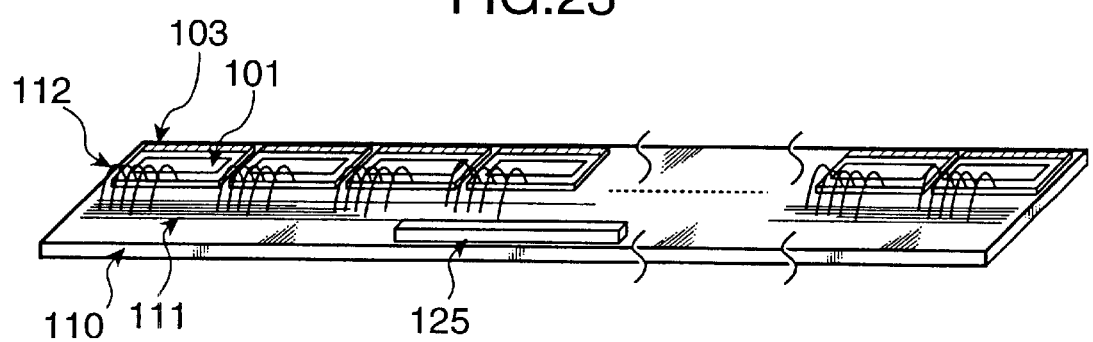
FIG. 23 is a perspective view of a third conventional optical printer head constructed using the light emitting element arrays shown in FIG. 21.
Figure 24:
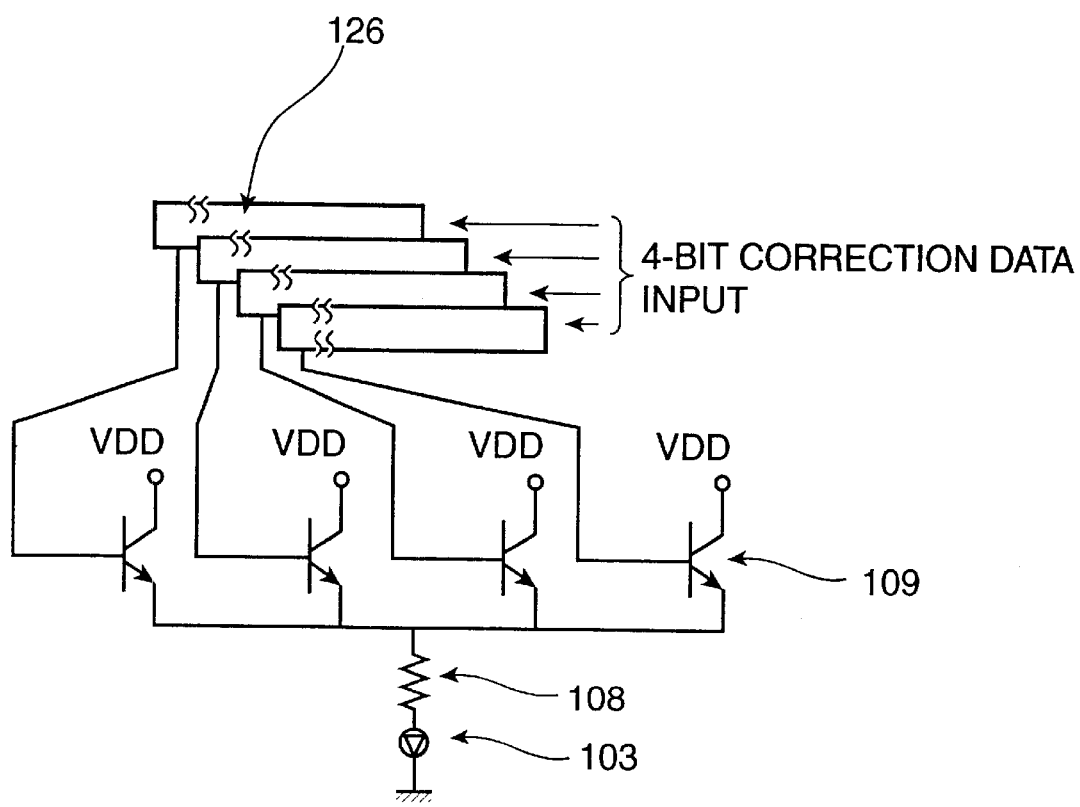
FIG. 24 is a block diagram of a 4-bit correction driver circuit.

FIG. 16 is a plan view showing the construction of an optical printer head 24b formed by mounting a plurality of light emitting element arrays 1b according to the third embodiment on the circuit board 10 on which an external driver 29 constituting an emission controller is mounted. Light emissions of the light emitting elements 3 of the light emitting element arrays 1a are controlled by serial data (light emitting element drive signals) supplied from the external driver 29 having a light intensity variation correcting function and a gradation controlling function as described above. The driver circuits 9 (see FIG. 12) for switching the respective light emitting elements 3 are driven in synchronism with the reset signals and the block signals from the external driver 29.

The external driver 29 is constructed similar to the external driver 25 of the first embodiment, and the respective output terminals thereof are connected with the electrode pads 14 to 21 shown in FIG. 14. The driver circuit power supply, the reset signal, the block signal, the light emitting element drive signal, etc. are respectively supplied to the respective electrode pads 14 to 21 at timings shown in FIG. 15. Here, correction values for the light emitting element drive signals to be supplied to the respective light emitting elements 3 are stored in correspondence with the light intensity variations of the respective light emitting elements 3 in a memory of, e.g., a control circuit provided at a previous stage. The light emitting element drive signals are supplied to the light emitting elements 3 after being corrected based on the stored correction values.

In the optical printer head 24b thus constructed, 8 bonding wires are used per light emitting element array 1b (1 chip) and the number of bonding wires 12 used for the connection with the circuit pattern 11 of the circuit board 10 can be reduced to about $\frac{1}{15}$ as compared with the conventional light emitting element array having 128 light emitting elements. Thus, a mounting cost can be significantly reduced, and the optical printer head can be made more inexpensive and more reliable.

Further, the number of the electrode pads which take up a larger space than the circuit pattern 11 can likewise be reduced to about $\frac{1}{15}$. This enables a length of the shorter sides of the circuit board 10 to be significantly reduced and the optical printer head 24b to be less costly and to be smaller.

In this optical printer head 24b as well, if the turn-on directions of the light emitting elements 3 are opposed to each other as shown in FIG. 11B as in the optical printer head 24a according to the second embodiment, high-speed printing can be performed since no printing shear occurs between the respective groups. Further, if the light emitting elements 3 are obliquely arranged with respect to main scanning direction so that a printing direction becomes horizontal as shown in FIG. 11C, printing can be performed at an even higher speed.

As described above, in the light emitting element array 1b according to the second embodiment and in the optical printer head 24b constructed using the light emitting element arrays 1b, the light emitting elements 3 are selectively driven by connecting one end of each of the light emitting elements 3 arranged in a row with the common line connected with the ground and connecting the other end thereof with the common lines to which the light emitting element drive signals are supplied via the switching elements. Thus, the levels of the currents flowing in the respective light emitting elements 3 and the application periods can be individually adjusted or the levels of the voltages applied to the respective light emitting elements 3 and periods during which the applied voltages are held at a specified level can be individually adjusted. This enables an easy correction of the light intensity variation of the light emitting elements 3 and an easy gradation control. Further, a plurality of light emitting elements 3 arranged in a row are divided into two groups, and pairs of the light emitting elements 3 are simultaneously driven one by one in each group while the light emitting elements 3 of the respective groups are driven in parallel. Therefore, the optical printer head can be operated at a higher speed.

Further, an area taken up by the driver circuits and the electrode pads, the number of bonding and the number of the external drivers are reduced, leading to a reduction in the production cost of the optical printer head, a smaller size, a significantly shortened mounting time, and a simplified assembling operation of the optical printer head. By spacing the electrode pads 14 to 21 of the light emitting element array 1b and the light emitting elements 3 thereof apart by a distance of 200 μm or longer, reflection of the lights emitted from the light emitting elements 3 by the bonding wires 12 and the like near the electrode pads 14 to 21 can be effectively prevented, thereby improving the reliability of the optical printer head.

As described above, the light emitting element array of the present invention is provided with a plurality of light emitting elements arranged in a row, the switching elements connected in series with the respective light emitting elements and provided with the control terminals for supplying the emission signals to the respective light emitting elements, and the electrical driver for individually turning the respective switcher on by individually supplying the connection drive signals to the control terminals of the respective switching elements.

With the light emitting element array thus constructed, when the switching elements are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control required for higher quality printing. Further, since the entire circuit construction is simpler as compared with the conventional ones, the light emitting element array can be made smaller and the production cost thereof can be reduced. The switching element may be formed of a transistor, and the electrical driver may be formed of a shift register including a plurality of flip-flops.

Further, according to the inventive light emitting element array, the light emitting elements, the switching elements and the electrical driver may be integrally formed on the semiconductor substrate. Such a formation enables an easy miniaturization and a mass production.

According to the inventive light emitting element array, the electrical connector of the respective driving groups may simultaneously turn on a plurality of the switching devices of the corresponding driving groups. Since a plurality of light emitting elements of each driving group can be simultaneously driven, the optical printer head can operate at an even higher speed.

According to the inventive light emitting element array, the electrode pad commonly connected with one polarity of each light emitting element, the electrode pad commonly connected with the other polarity of each light emitting element, the electrode pad commonly connected with the first input terminal of each flip-flop, the electrode pad commonly connected with the second input terminal of each flip-flop and the electrode pad commonly connected with the drive power terminal of each flip-flop may be formed on the semiconductor substrate.

Such an arrangement enables the number of the electrode pads to be effectively reduced, leading to a further miniaturization of the light emitting element array. Further, since the number of the electrode pads is reduce, the number of the bonding wires corresponding to the electrode pads can be reduced, resulting in a reduced mounting cost and an improved reliability of the optical printer head.

According to the inventive light emitting element array, the semiconductor substrate may have a rectangular shape, and the plurality of light emitting elements are arranged along one longer side thereof while the plurality of electrode pads are arranged along the other longer side thereof. With such an arrangement, the length of the shorter sides of the circuit board for the optical printer head can be shortened and the optical printer head can be made smaller.

Another inventive light emitting element array is provided with a plurality of light emitting elements arranged in a row and divided into a plurality of drive groups; switching elements connected in series with the respective light emitting elements of the respective drive groups, divided into a plurality of drive groups corresponding to those of the light emitting elements, and provided with control terminals for supplying emission signals to the respective light emitting elements; the electrical driver divided into a plurality of drive groups corresponding to those of the light emitting elements and adapted to individually turn the switching elements of the respective groups on at the same timings in each group by individually supplying the connection drive signals to the control terminals of the switching elements of the respective drive groups in each drive group.

In the light emitting element array thus constructed, when the switching elements of the respective groups are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing. Further, since the entire circuit construction is simpler as compared with the conventional ones, the light emitting element array can be made smaller and the production cost thereof can be reduced. Furthermore, since the light emitting elements of the respective drive groups are driven in parallel at the same timings in each drive group, the light emitting elements can be driven at a high speed, with the result that the optical printer head using the light emitting element arrays can print at a higher speed.

The switching element may be formed of a transistor, and the electrical driver may be formed of a shift register including a plurality of flip-flops. Further, the light emitting elements, the switching elements and the electrical driver may be integrally formed on the semiconductor substrate.

According to this inventive light emitting element array, the electrode pad commonly connected with one polarity of each light emitting element of each drive group, the electrode pad commonly connected with the other polarity of each light emitting element of each drive group, the electrode pad commonly connected with the first input terminal of each flip-flop, the electrode pad commonly connected with the second input terminal of each flip-flop and the electrode pad commonly connected with the drive power terminal of each flip-flop may be formed on the semiconductor substrate.

Such an arrangement enables the number of the electrode pads to be effectively reduced, leading to a further miniaturization of the light emitting element array. Further, since the number of the electrode pads is reduce, the number of the bonding wires corresponding to the electrode pads can be reduced, resulting in a reduced mounting cost and an improved reliability of the optical printer head. It may be noted that the semiconductor substrate may have a rectangular shape, and the plurality of light emitting elements may be arranged along one longer side while the plurality of electrode pads may be arranged along the other longer side.

The inventive optical printer head is provided with the light emitting element arrays including a plurality of light emitting elements arranged in a row, the switching elements connected in series with the respective light emitting elements and provided with the control terminals for supplying the emission signals to the respective light emitting elements and, and the electrical driver for individually turning the respective switcher on by individually supplying the connection drive signals to the control terminals of the respective switching elements; and the emission controller for driving the electrical driver by supplying the connection drive signals to the electrical driver and individually driving the light emitting elements connected with the switching elements by supplying the emission signals thereto when these switching elements are individually turned on.

In the optical printer head thus constructed, when the switching elements are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing. Further, since the light emitting element array can be made smaller and the production cost thereof can be reduced, the optical printer head can be made smaller and the production cost thereof can be reduced.

In the inventive optical printer head, the emission controller may individually adjust amounts of light emitted from the light emitting elements by changing the levels of the emission signals to be supplied to the light emitting elements in such a manner as to correspond to the light emitting elements.

With such an arrangement, by changing the levels of the emission signals to be supplied to the light emitting elements in such a manner as to correspond to the light emitting elements, the light intensity variation of the light emitting elements can be easily corrected and the gradation control can be easily performed. The level of the emission signal may represent a level of a current flowing in the light emitting element, an application period of a current to the light emitting element, and an amount of a current flowing in the light emitting element.

In the inventive optical printer head, the light emitting element arrays may be formed using semiconductor substrates and the plurality of light emitting element arrays and the emission controller may be mounted on a circuit board. Since such a construction enables a further miniaturization of the light emitting element arrays, miniaturization of the optical printer head can be further urged.

Another inventive optical printer head is provided with the light emitting element arrays each including a plurality of light emitting elements arranged in a row and divided into a plurality of drive groups; switching elements connected in series with the respective light emitting elements of the respective drive groups, divided into a plurality of drive groups corresponding to those of the light emitting elements, and provided with control terminals for supplying emission signals to the respective light emitting elements; the electrical driver divided into a plurality of drive groups corresponding to those of the light emitting elements and adapted to individually turn the switching elements of the respective groups on at the same timings in each group by individually supplying the connection drive signals to the control terminals of the switching elements of the respective drive groups in each drive group, and the emission controller for driving the electrical driver divided into the plurality of drive groups at the same timings in each drive group by supplying the connection drive signals to the electrical driver at the same timings in each group, and individually driving the light emitting elements of each drive group connected with the switching elements by supplying the emission signals thereto when these switching elements are individually turned on at the same timings in each drive group.

In the inventive optical printer head thus constructed, when the switching elements of the respective groups are turned on, the emission signals, whose levels are so changed as to correspond to the respective light emitting elements, are supplied to the light emitting elements connected with these switching elements, thereby enabling an easy correction of the light intensity variation of the respective light emitting elements and an easy gradation control necessary for higher quality printing. Further, since the light emitting element array can be made smaller and the production cost thereof can be reduced, the optical printer head can be made smaller and the production cost thereof can be reduced. Furthermore, since the light emitting elements of the respective drive groups are driven in parallel at the same timings in each drive group, the optical printer head can print at a higher speed.

In this inventive optical printer head, the emission controller may individually adjust amounts of light emitted from the light emitting elements by changing the levels of the emission signals to be supplied to the light emitting elements of the respective drive groups in such a manner as to correspond to the light emitting elements.

With such an arrangement, by changing the levels of the emission signals to be supplied to the light emitting elements in such a manner as to correspond to the light emitting elements in such a manner as to correspond to the light emitting elements, the light intensity variation of the light emitting elements can be easily corrected and the gradation control can be easily performed. The level of the emission signal may represent a level of a current flowing in the light emitting element, an application period of a current to the light emitting element, and an amount of a current flowing in the light emitting element.

Further in the inventive optical printer head, the emission controller may simultaneously drive the light emitting elements at positions symmetrical with respect a boundary between the adjacent drive groups of the light emitting elements. Such simultaneous driving enables realization of high-speed printing since no printing shear occurs between the respective drive groups.

Further in the inventive optical printer head, the electrical driver of the respective drive groups may simultaneously turn a plurality of the switching elements on in the corresponding drive groups, and the emission controller may simultaneously drive the light emitting elements connected with the plurality of switching elements of the respective groups by supplying the emission signals thereto when these switching elements are turned on. Since a plurality of light emitting elements of the respective drive groups are simultaneously driven, the optical printer head can print at an even higher speed.

This application is based on patent application Nos. 2000-158701, 2000-158826, and 2000-197397 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An optical printer head comprising:

a light emitting element array including:

a single semiconductor substrate;

a plurality of light emitting elements formed on the single semiconductor substrate arranged in a row and divided into a plurality of drive groups the light emitting elements being operative to emit light in an amount in accordance with a pulse width and an amplitude of an electrical emission signal;

a plurality of switching elements formed on the single semiconductor substrate and divided into a plurality of drive groups corresponding to those of the light emitting elements, a plurality of switching element of one drive group being connected at their respective one ends with the respective light emitting elements of the corresponding drive group, and connected at their respective opposite ends with a common electric line arranged in the corresponding drive group, the common electric line being supplied with the electrical emission signal; and a plurality of electrical drivers formed on the single semiconductor substrate, the plurality of electrical drivers being divided into a plurality of drive groups corresponding to those of the light emitting elements and adapted to change over the on-off state of the plurality of the switching elements of one drive group one after another at the same timings as the plurality of switching elements of another drive group; and an emission controller for driving the plurality of electrical drivers divided into the plurality of drive groups by supplying a connection drive signal to the electrical driver of one drive group to change over the on-off state of the switching elements one after another at the same timing as the switching elements of another drive group so that the plurality of switching elements of each drive group allow the electrical emission signal to flow to the plurality of light emitting elements of the corresponding drive group one after another;

wherein the emission controller drives the plurality of electrical drivers so as to allow the light emitting elements of one drive group at positions symmetrical with respect to a boundary between the light emitting elements of the adjacent drive group to emit light at the same time as the light emitting elements of the adjacent drive group.

2. An optical printer head according to claim 1, wherein the emission controller individually adjusts amounts of light emitted from the light emitting elements by changing the levels of the emission signals to be supplied to the light emitting elements by way of the common electric line in correspondence to each drive group and the switching elements in such a manner as to correspond to the light emitting elements.

3. An optical printer head according to claim 2, wherein the level of the emission signal represents a level of a current flowing in the light emitting element and an application period of a current to the light emitting element.

4. An optical printer head according to claim 2, wherein the level of the emission signal represents an application period of a current to the light emitting element.

5. An optical printer head according to claim 2, wherein the level of the emission signal represents a level of a current flowing in the light emitting element.

6. An optical printer head according to claim 1, wherein the light emitting element arrays and the emission controller are mounted on a circuit board.

7. An optical printer head according to claim 1, wherein the plurality of electrical drivers of the respective drive groups change over the on-off state of the plurality of switching elements of the corresponding drive group by a specified number of switching elements at the same timing as the plurality of switching elements of another drive group.

* * * * *